US008268528B2

(12) United States Patent
Harada et al.

(10) Patent No.: US 8,268,528 B2
(45) Date of Patent: *Sep. 18, 2012

(54) RESIST COMPOSITION AND PATTERNING PROCESS

(75) Inventors: Yuji Harada, Joetsu (JP); Jun Hatakeyama, Joetsu (JP); Koji Hasegawa, Joetsu (JP); Kazunori Maeda, Joetsu (JP); Tomohiro Kobayashi, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 219 days.

This patent is subject to a terminal disclaimer.

(21) Appl. No.: 12/628,794

(22) Filed: Dec. 1, 2009

(65) Prior Publication Data

US 2010/0136482 A1  Jun. 3, 2010

(30) Foreign Application Priority Data

Dec. 2, 2008 (JP) ................................. 2008-307213

(51) Int. Cl.
G03F 7/004 (2006.01)
G03F 7/028 (2006.01)
G03F 7/039 (2006.01)
G03F 7/26 (2006.01)

(52) U.S. Cl. ..................................... 430/270.1; 430/326

(58) Field of Classification Search ............... 430/270.1, 430/296, 326, 330, 908, 910
See application file for complete search history.

(56) References Cited

U.S. PATENT DOCUMENTS

| 5,541,037 | A | 7/1996 | Hatakeyama et al. | |
| 6,312,867 | B1 | 11/2001 | Kinsho et al. | |
| 6,800,414 | B2* | 10/2004 | Nishimura et al. | 430/270.1 |
| 6,869,744 | B2 | 3/2005 | Hatakeyama | |
| 7,244,545 | B2 | 7/2007 | Takebe et al. | |
| 7,455,952 | B2 | 11/2008 | Hatakeyama et al. | |
| 7,537,880 | B2 | 5/2009 | Harada et al. | |
| 7,622,242 | B2* | 11/2009 | Hatakeyama et al. | 430/270.1 |
| 2005/0064297 | A1* | 3/2005 | Wago | 430/5 |
| 2007/0122736 | A1 | 5/2007 | Hatakeyama et al. | |
| 2007/0179309 | A1 | 8/2007 | Hasegawa et al. | |
| 2008/0032202 | A1 | 2/2008 | Ishizuka et al. | |
| 2008/0090172 | A1 | 4/2008 | Hatakeyama et al. | |
| 2008/0118860 | A1* | 5/2008 | Harada et al. | 430/270.1 |
| 2009/0011365 | A1* | 1/2009 | Kobayashi et al. | 430/284.1 |
| 2009/0053650 | A1 | 2/2009 | Irie | |
| 2009/0081588 | A1* | 3/2009 | Hatakeyama et al. | 430/285.1 |
| 2009/0130592 | A1 | 5/2009 | Wang | |
| 2009/0142715 | A1 | 6/2009 | Araki et al. | |
| 2009/0181323 | A1 | 7/2009 | Kanda et al. | |
| 2009/0208867 | A1* | 8/2009 | Harada et al. | 430/271.1 |
| 2009/0208873 | A1* | 8/2009 | Harada et al. | 430/286.1 |
| 2010/0266957 | A1* | 10/2010 | Harada et al. | 430/285.1 |

FOREIGN PATENT DOCUMENTS

| JP | 60-38821 A | 2/1985 |
| JP | 62-62520 A | 3/1987 |
| JP | 62-62521 A | 3/1987 |
| JP | 6-273926 A | 9/1994 |
| JP | 9-246173 A | 9/1997 |
| JP | 2803549 B2 | 7/1998 |
| JP | 2000-336121 A | 12/2000 |
| JP | 2005-264131 A | 9/2005 |
| JP | 2006-48029 A | 2/2006 |
| JP | 2006-91798 A | 4/2006 |
| JP | 2006-133716 A | 5/2006 |
| JP | 2006-309245 A | 11/2006 |
| JP | 2007-140446 A | 6/2007 |
| JP | 2007-187887 A | 7/2007 |
| JP | 2007-204385 A | 8/2007 |
| JP | 2008-111103 A | 5/2008 |
| JP | 2008-122932 A | 5/2008 |
| WO | WO 2005/042453 A1 | 5/2005 |
| WO | WO 2005/069676 A1 | 7/2005 |

OTHER PUBLICATIONS

Allen et al., "Design of Protective Topcoats for Immersion Lithography", Journal of Photopolymer Science and Technology, vol. 18, No. 5, p. 615, 2005.
Hirayama, "Resist and Cover Material Investigation for Immersion Lithography", 2nd Immersion Workshop, Jul. 11, 2003.
Ito et al., "Aliphatic platforms for the design of 157 nm chemically amplified resists", Proc. SPIE, vol. 4690, p. 18, 2002.
Lin "Semiconductor Foundry, Lithography, and Partners" Proc. SPIE, vol. 4690, xxix, 2002.
Murase et al., "Characterization of molecular interfaces in hydrophobic systems", Progress in Organic Coatings, 31, p. 97 (1997).
Murase et al., "Neuer Begriff und ein Nano-Hybrid System fur Hydrophobia" XXIV FATIPEC Congress Book, vol. B, p. 15 (1997).
Nakano et al., "Defectivity data taken with a full-field immersion exposure tool", 2nd International Symposium on Immersion Lithography, Sep. 12-15, 2005, pp. 1-27.
Owa et al. "Immersion lithography; its potential performance and issues" Proc. SPIE, vol. 5040, p. .724, 2003.
Shirota et al. "Development of non-topcoat resist polymers for 193-nm immersion lithography", Proc. SPIE, vol. 6519, p. 651905 (2007).

* cited by examiner

Primary Examiner — Anca Eoff
(74) Attorney, Agent, or Firm — Birch, Stewart, Kolasch & Birch, LLP

(57) ABSTRACT

A resist composition is provided comprising (A) an additive polymer of acyl-protected hexafluoroalcohol structure, (B) a base polymer having a structure derived from lactone ring, hydroxyl group and/or maleic anhydride, the base polymer becoming soluble in alkaline developer under the action of acid, (C) a photoacid generator, and (D) an organic solvent. The additive polymer is transparent to radiation of wavelength up to 200 nm, and its properties can be tailored by a choice of the polymer structure.

19 Claims, No Drawings

RESIST COMPOSITION AND PATTERNING PROCESS

CROSS-REFERENCE TO RELATED APPLICATION

This non-provisional application claims priority under 35 U.S.C. §119(a) on Patent Application No. 2008-307213 filed in Japan on Dec. 2, 2008, the entire contents of which are hereby incorporated by reference.

TECHNICAL FIELD

This invention generally relates to a photolithography process for the microfabrication of semiconductor devices, and particularly to an immersion photolithography process involving directing ArF excimer laser radiation having a wavelength of 193 nm from a projection lens toward a resist-coated substrate, with a liquid (e.g., water) intervening between the lens and the substrate. More particularly, it relates to a resist composition for use in the photolithography process, and a process for forming a pattern using the same.

BACKGROUND ART

In the recent drive for higher integration and operating speeds in LSI devices, the pattern rule is made drastically finer. The background supporting such a rapid advance is a reduced wavelength of the light source for exposure. The change-over from i-line (365 nm) of a mercury lamp to shorter wavelength KrF laser (248 nm) enabled mass-scale production of dynamic random access memories (DRAM) with an integration degree of 64 MB (processing feature size $\leq 0.25$ µm). To establish the micropatterning technology necessary for the fabrication of DRAM with an integration degree of 256 MB and 1 GB or more, the lithography using ArF excimer laser (193 nm) is under active investigation. The ArF excimer laser lithography, combined with a high NA lens (NA $\geq 0.9$), is considered to comply with 65-nm node devices. For the fabrication of next 45-nm node devices, the $F_2$ laser lithography of 157 nm wavelength became a candidate. However, because of many problems including a cost and a shortage of resist performance, the employment of $F_2$ lithography was postponed. ArF immersion lithography was proposed as a substitute for the $F_2$ lithography. Efforts have been made for the early introduction of ArF immersion lithography (see Proc. SPIE, Vol. 4690, xxix, 2002).

In the ArF immersion lithography, the space between the projection lens and the wafer is filled with water and ArF excimer laser is irradiated through the water. Since water has a refractive index of 1.44 at 193 nm, pattern formation is possible even using a lens with NA of 1.0 or greater. Theoretically, it is possible to increase the NA to 1.44. The resolution is improved by an increment of NA. A combination of a lens having NA of at least 1.2 with ultra-high resolution technology suggests a way to the 45-nm node (see Proc. SPIE, Vol. 5040, p 724, 2003).

Several problems arise when a resist film is exposed in the presence of water. For example, the acid once generated from a photoacid generator and a basic compound added to the resist can be partially leached in water. As a result, pattern profile changes and pattern collapse can occur. It is also pointed out that water droplets remaining on the resist film, though in a minute volume, can penetrate into the resist film to generate defects.

These drawbacks of the ArF immersion lithography may be overcome by providing a protective coating between the resist film and water to prevent resist components from being leached out and water from penetrating into the resist film (see the 2nd Immersion Workshop, Resist and Cover Material Investigation for Immersion Lithography, 2003).

With respect to the protective coating on the photoresist film, a typical antireflective coating on resist (ARCOR) process is disclosed in JP-A 62-62520, JP-A 62-62521, and JP-A 60-38821. The ARCs are made of fluorinated compounds having a low refractive index, such as perfluoroalkyl polyethers and perfluoroalkyl amines. Since these fluorinated compounds are less compatible with organic substances, fluorocarbon solvents are used in coating and stripping of protective coatings, raising environmental and cost issues.

Other resist protective coating materials under investigation include water-soluble or alkali-soluble materials. See, for example, JP-A 6-273926, Japanese Patent No. 2,803,549, and J. Photopolymer Sci. and Technol., Vol. 18, No. 5, p 615, 2005. Since the alkali-soluble resist protective coating material is strippable with an alkaline developer, it eliminates a need for an extra stripping unit and offers a great cost saving. From this standpoint, great efforts have been devoted to develop water-insoluble resist protective coating materials, for example, resins having alkali-soluble groups such as fluorinated alcohol, carboxyl or sulfo groups on side chains. See WO 2005/42453, WO 2005/69676, JP-A 2005-264131, JP-A 2006-133716, and JP-A 2006-91798.

As means for preventing resist components from being leached out and water from penetrating into the resist film without a need for a protective coating material, it is proposed in JP-A 2006-48029, JP-A 2006-309245, and JP-A 2007-187887 to add an alkali-soluble, hydrophobic, high-molecular-weight compound as a surfactant to the resist material. This method achieves equivalent effects to the use of protective coating material because the hydrophobic compound is segregated at the resist surface during resist film formation. Additionally, this method is economically advantageous over the use of a protective film because steps of forming and stripping the protective film are unnecessary.

It is believed that independent of whether the alkali-soluble surfactant or the resist protective coating material is used, water droplets remaining on the resist film or protective film after scanning cause failure (or defects) in pattern formation. The ArF immersion lithography systems commercially available at the present are designed such that exposure is carried out by scanning the wafer-mounted stage at a speed of 300 to 550 nm/sec while water is partly held between the projection lens and the wafer. In the event of such high-speed scanning, unless the performance of the resist or protective film is sufficient, water cannot be held between the projection lens and the wafer, and water droplets are left on the surface of the resist film or protective film after scanning. Such residual droplets can cause defects to the pattern.

To eliminate defects owing to residual droplets, it is necessary to improve the flow or mobility of water (hereinafter, water slip) on the relevant coating film and the water repellency of the film. It is reported effective to increase the receding contact angle of the resist or protective film with water. See 2nd International Symposium on Immersion Lithography, 12-15 Sep., 2005, Defectivity data taken with a full-field immersion exposure tool, Nakano et al.

For improving the water repellency of a coating film, introduction of fluorine into a base resin is effective. For improving water slip, combining water-repellent groups of different species to form a microdomain structure is effective. See XXIV FATIPEC Congress Book, Vol. B, p 15 (1997) and Progress in Organic Coatings, 31, p 97 (1997). According to these reports, when a water molecule interacts with methyl and trifluoromethyl groups, it orients via its oxygen and hydrogen atoms, and the orientation distance between water and methyl is longer. Thus a resin having not only water repellent fluorinated units introduced, but also both fluoroalkyl and alkyl groups incorporated is improved in water slip because of a longer orientation distance of water.

One exemplary material known to have excellent water slip and water repellency is a copolymer of α-trifluoromethylacrylate and norbornene derivative (Proc. SPIE, Vol. 4690, p 18, 2002). While this polymer was originally developed as a highly transparent resin for $F_2$ (157 nm) lithography resist materials, it is characterized by a regular arrangement of molecules of water repellent α-trifluoromethylacrylate and norbornene derivative in a ratio of 2:1. This characteristic arrangement increases the orientation distance of water relative to the resin and improves water slip. In fact, when this polymer is used as the base polymer in a protective coating for immersion lithography, water slip is drastically improved, as described in JP-A 2007-140446 or US 20070122736.

Another example of the highly water repellent/water slippery material is a fluorinated ring-closing polymerization polymer having hexafluoroalcohol groups on side chains. This polymer is further improved in water slip by protecting hydroxyl groups on side chains with acid labile groups, as reported in Proc. SPIE. Vol. 6519, p 651905 (2007).

A material having good water slip performance is required not only from the standpoint of defects, but also from the standpoint of productivity. The immersion lithography needs higher throughputs than ever. For improved productivity, the exposure time must be reduced, which in turn requires high-speed scanning operation of the stage. In order to move the stage at a high speed while holding water beneath the lens, it is desired to have a resist material or resist protective film having higher water slip performance.

The highly water repellent/water slippery materials discussed above are expected to be applied not only to the ArF immersion lithography, but also to the resist material for mask blanks. Resist materials for mask blanks suffer from problems including a change of sensitivity during long-term exposure in vacuum and long-term stability after coating. With respect to the control of sensitivity changes in vacuum, an improvement is made by a combination of acid labile groups of acetal and tertiary ester types (U.S. Pat. No. 6,869,744). It is believed that after coating of a resist material, an amine component is adsorbed to the resist film surface whereby the resist varies its sensitivity or profile. A method of modifying the surface of a resist film for preventing adsorption of an amine component to the resist film has been devised.

CITATION LIST

Patent Document 1: JP-A S62-62520
Patent Document 2: JP-A S62-62521
Patent Document 3: JP-A S60-38821
Patent Document 4: JP-A H06-273926
Patent Document 5: JP 2803549
Patent Document 6: WO 2005/42453
Patent Document 7: WO 2005/69676
Patent Document 8: JP-A 2005-264131
Patent Document 9: JP-A 2006-133716
Patent Document 10: U.S. Pat. No. 7,455,952 (JP-A 2006-91798)
Patent Document 11: JP-A 2006-048029
Patent Document 12: JP-A 2006-309245
Patent Document 13: JP-A 2007-187887
Patent Document 14: US 20070122736 (JP-A 2007-140446)
Patent Document 15: U.S. Pat. No. 6,869,744
Non-Patent Document 1: Proc. SPIE, Vol. 4690, xxix, 2002
Non-Patent Document 2: Proc. SPIE, Vol. 5040, p 724, 2003
Non-Patent Document 3: 2nd Immersion Workshop, Resist and Cover Material Investigation for Immersion Lithography (2003)
Non-Patent Document 4: J. Photopolymer Sci. and Technol., Vol. 18, No. 5, p 615, 2005
Non-Patent Document 5: 2nd International Symposium on Immersion Lithography, 12-15 Sep., 2005, Defectivity data taken with a full-field immersion exposure tool, Nakano et al.
Non-Patent Document 6: XXIV FATIPEC Congress Book, Vol. B, p 15 (1997)
Non-Patent Document 7: Progress in Organic Coatings, 31, p 97 (1997)
Non-Patent Document 8: Proc. SPIE, Vol. 4690, p 18, 2002
Non-Patent Document 9: Proc. SPIE, Vol. 6519, p 651905 (2007)

SUMMARY OF INVENTION

An object of the invention is to provide a resist composition for immersion lithography which comprises an additive polymer so that the composition may have improved water repellency and water slip, cause few development defects, and form a resist pattern of satisfactory profile after development; and a pattern forming process using the resist composition.

The inventors have found that a polymer of acyl-protected fluoroalcohol structure, as represented by formula (1) below, has sufficient water repellency and water slip for use as an additive polymer in resist material. The polymer is highly transparent to radiation of wavelength up to 200 nm. Properties of the polymer including water repellency, water slip, fat solubility, acid lability, and hydrolysis can be tailored by a choice of the structure. The polymer can be prepared from reactants which are readily available and easy to handle.

In one aspect, the invention provides a resist composition comprising (A) a polymer comprising recurring units of the general formula (1), (B) a base polymer having a structure derived from lactone ring, hydroxyl group and/or maleic anhydride, said base polymer becoming soluble in alkaline developer under the action of acid, (C) a compound capable of generating an acid upon exposure to high-energy radiation, and (D) an organic solvent.

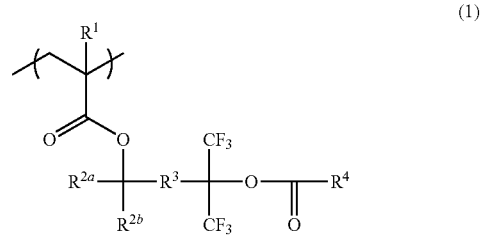

Herein $R^1$ is hydrogen, methyl or trifluoromethyl, $R^{2a}$ and $R^{2b}$ are hydrogen or straight, branched or cyclic $C_1$-$C_{15}$ alkyl, $R^{2a}$ and $R^{2b}$ may bond together to form a ring with the carbon atom to which they are attached, $R^3$ is a single bond or straight, branched or cyclic $C_1$-$C_{15}$ alkylene, and $R^4$ is a straight, branched or cyclic $C_1$-$C_{20}$ alkyl or fluoroalkyl which may contain —O— or —C(=O)—.

The polymer comprising recurring units of the general formula (1) as component (A) may further comprise recurring units of one or multiple types selected from the general formulae (2a) to (2f).

(2a) 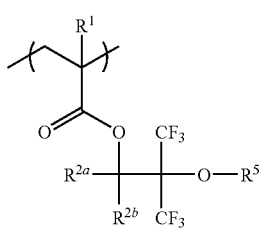

(2b) 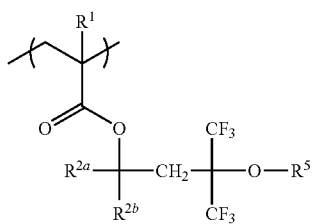

(2c) 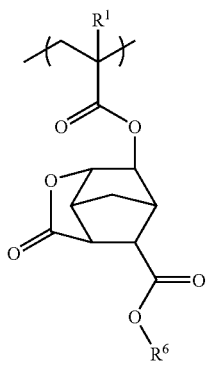

(2d) 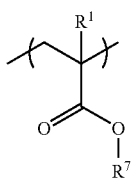

(2e) 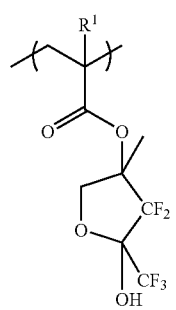

(2f) 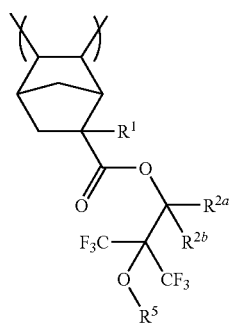

Herein $R^1$, $R^{2a}$ and $R^{2b}$ are as defined above, $R^5$ is hydrogen, a straight, branched or cyclic $C_1$-$C_{15}$ alkyl or fluoroalkyl, or an acid labile group, $R^6$ is a straight, branched or cyclic $C_1$-$C_{15}$ fluoroalkyl, and $R^7$ is an acid labile group.

In a preferred embodiment, the resist composition may further comprise (E) a basic compound and/or (F) a dissolution inhibitor.

In another aspect, the invention provides;

a pattern forming process comprising the steps of (1) applying the resist composition defined above onto a substrate to form a resist film, (2) heat treating the resist film and exposing it to high-energy radiation through a photomask, and (3) developing the exposed resist film with a developer;

a pattern forming process comprising the steps of (1) applying the resist composition defined above onto a substrate to form a resist film, (2) heat treating the coated substrate, and exposing it to high-energy radiation through a photomask while keeping a liquid between a projection lens and the coated substrate, and (3) developing the exposed resist film with a developer; and a pattern forming process comprising the steps of (1) applying the resist composition defined above onto a substrate to form a resist film, (2) forming a protective coating on the resist film, (3) heat treating the coated substrate, and exposing it to high-energy radiation through a photomask while keeping a liquid between a projection lens and the coated substrate, and (4) developing the exposed resist film with a developer.

The liquid is typically water. Preferably an exposure light source emits high-energy radiation having a wavelength of 180 to 250 nm.

Also provided is a pattern forming process comprising the steps of (1) applying the resist composition defined above onto a mask blank to form a coating, (2) heat treating the coating and irradiating it in vacuum with an electron beam, and (3) developing the coating with a developer.

ADVANTAGEOUS EFFECTS OF INVENTION

A polymer of acyl-protected fluoroalcohol structure is useful as an additive polymer in resist material. The polymer is highly transparent to radiation of wavelength up to 200 nm. Properties of the polymer including water repellency, water slip, fat solubility, acid lability, and hydrolysis susceptibility can be tailored by a choice of the polymer structure. The polymer can be prepared from reactants which are readily available and easy to handle.

DESCRIPTION OF EMBODIMENTS

The singular forms "a", "an" and "the" include plural references unless the context clearly dictates otherwise.

The notation (Cn-Cm) means a group containing from n to m carbon atoms per group.

Additive Polymer

The polymer used as an additive polymer in the resist composition of the invention is characterized by comprising recurring units of the general formula (1).

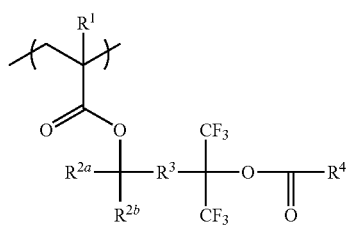

(1)

Herein $R^1$ is hydrogen, methyl or trifluoromethyl. $R^{2a}$ and $R^{2b}$ are hydrogen or straight, branched or cyclic $C_1$-$C_{15}$ alkyl, $R^{2a}$ and $R^{2b}$ may bond together to form a ring with the carbon atom to which they are attached. $R^3$ is a single bond or straight, branched or cyclic $C_1$-$C_{15}$ alkylene. $R^4$ is a straight, branched or cyclic $C_1$-$C_{20}$ alkyl or fluoroalkyl which may contain —O— or —C(=O)—.

In formula (1), examples of straight, branched or cyclic $C_1$-$C_{15}$ alkyl groups represented by $R^{2a}$ and $R^{2b}$, and straight, branched or cyclic $C_1$-$C_{20}$, preferably $C_1$-$C_{15}$, alkyl groups represented by $R^4$ include, but are not limited to, methyl, ethyl, n-propyl, isopropyl, n-butyl, sec-butyl, tert-butyl, tert-amyl, n-pentyl, n-hexyl, n-heptyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl, cyclohexylbutyl, and adamantyl. $R^{2a}$ and $R^{2b}$ may bond together to form a non-aromatic ring with the carbon atom to which they are attached. In this event, each of $R^{2a}$ and $R^{2b}$ is alkylene, examples of which include the above-exemplified alkyl groups with one hydrogen atom eliminated, and exemplary rings include cyclopentyl and cyclohexyl.

Suitable straight, branched or cyclic $C_1$-$C_{15}$ alkylene groups represented by $R^3$ include the above-exemplified alkyl groups with one hydrogen atom eliminated.

Suitable straight, branched or cyclic $C_1$-$C_{20}$, preferably $C_1$-$C_{15}$, fluoroalkyl groups represented by $R^4$ include the above-exemplified alkyl groups in which some or all hydrogen atoms are substituted by fluorine atoms. Examples include trifluoromethyl, 2,2,2-trifluoroethyl, 3,3,3-trifluoropropyl, 1,1,2,2,3,3,3-heptafluoropropyl, 1H,1H,3H-tetrafluoropropyl, 1H,1H,5H-octafluoropentyl, 1H,1H,7H-dodecafluoroheptyl, 2-(perfluorobutyl)ethyl, 2-(perfluorohexyl)ethyl, 2-(perfluorooctyl)ethyl, and 2-(perfluorodecyl)ethyl.

Examples of the recurring units having formula (1) are given below, but not limited thereto.

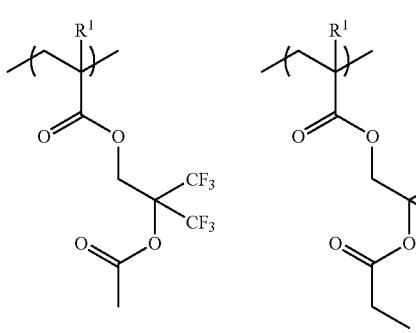

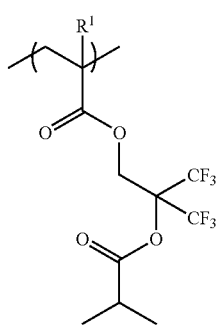

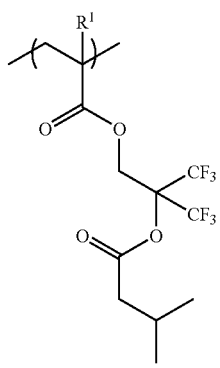

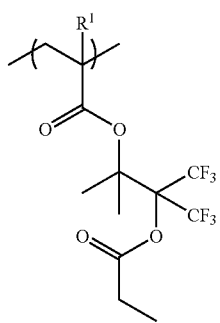

-continued

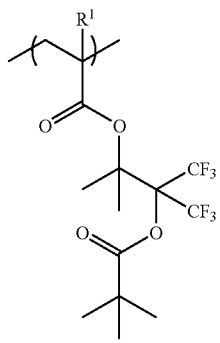

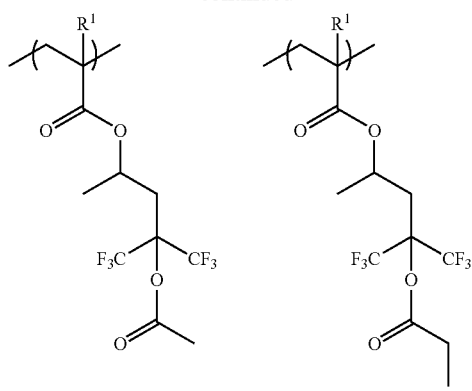
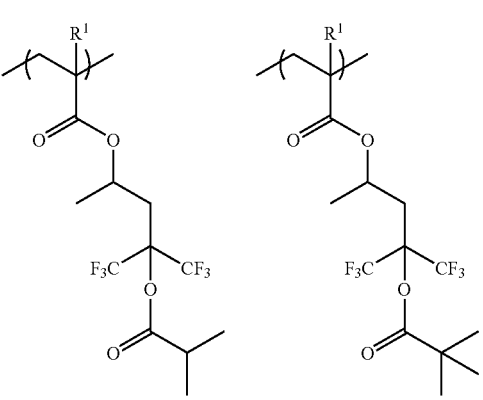
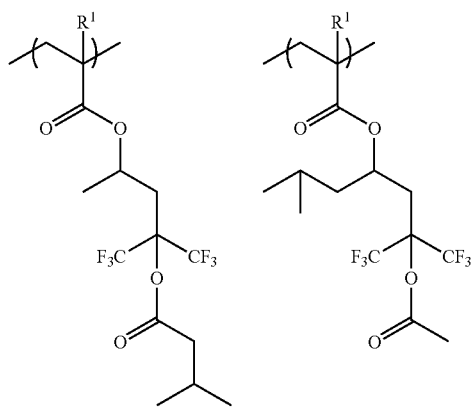
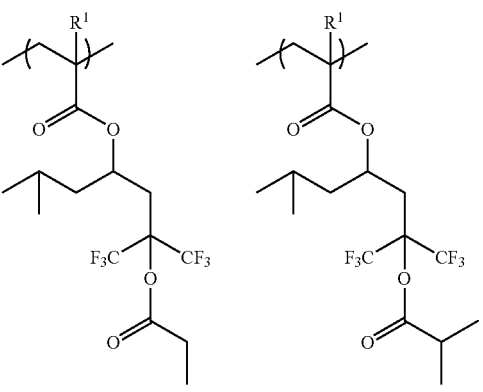
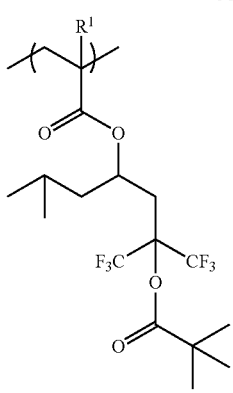
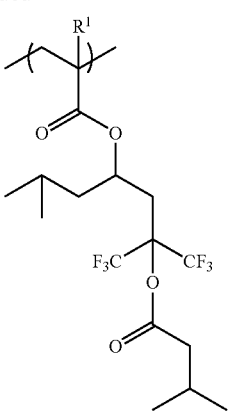
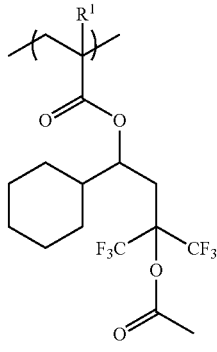
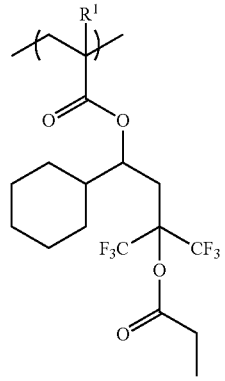
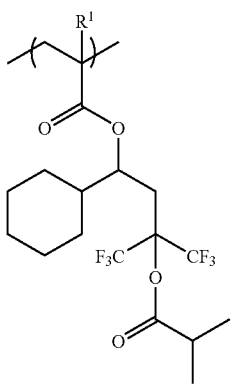
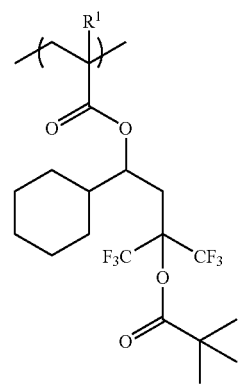
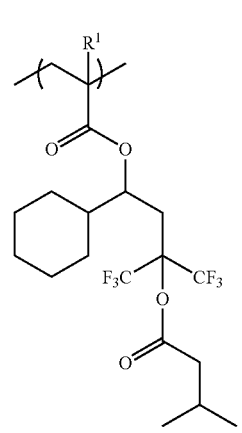
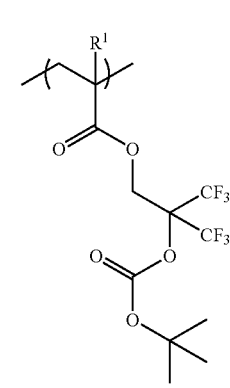

-continued

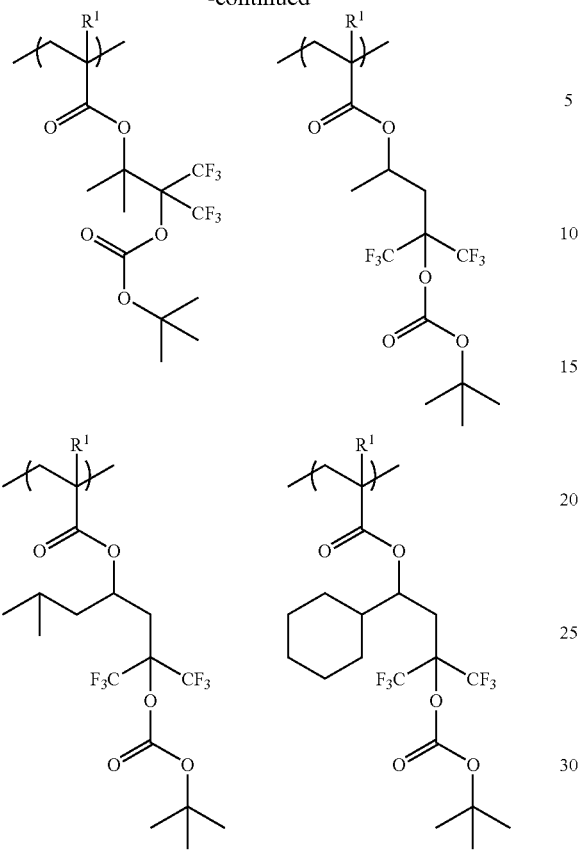

Herein R¹ is as defined above.

In the polymer for use as the additive to resist material, the recurring units of formula (1) contribute to improvements in water repellent and water slip properties. The polymer comprising recurring units of formula (1) is easy to control its structural factors, specifically the length of carbon chain, the degree of branching, and the number of fluorine atoms of $R^4$. Thus a polymer having water repellent and water slip properties necessary as a particular resist additive can be prepared.

If desired, the polymer may be endowed with alkaline hydrolysis susceptibility. In general, the hydroxyl group of fluoroalcohol has a higher acidity than the hydroxyl group of common alcohols. The ester bond in formula (1) is an ester of the hydroxyl group of fluoroalcohol having an even higher acidity due to the bonding of six fluorine atoms to adjacent carbons with a carboxylic acid, that is, a so-called mixed acid anhydride. Thus the ester bond in formula (1) is significantly susceptible to alkaline hydrolysis, as compared with the esters of common alcohols with carboxylic acids. Specifically, it is readily hydrolyzable with an alkaline developer or the like.

Hydrolysis of the ester bond in formula (1) results in a fluoroalcohol structure which is highly hydrophilic and highly alkaline soluble, which provides a reduction of the contact angle at polymer surface, especially after development, and contributes to a reduction of blob defects.

In addition to the recurring units of formula (1), the polymer may further comprise recurring units of one or multiple types selected from the general formulae (2a) to (2f). The polymer having additional recurring units incorporated herein is more improved in water repellency, water slip, alkaline solubility and contact angle after development.

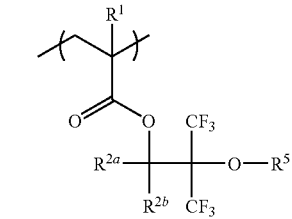 (2a)

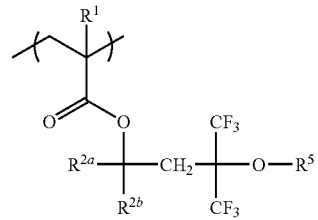 (2b)

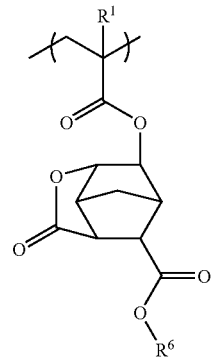 (2c)

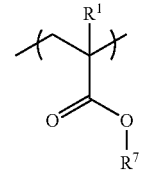 (2d)

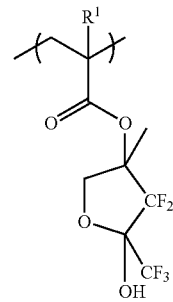 (2e)

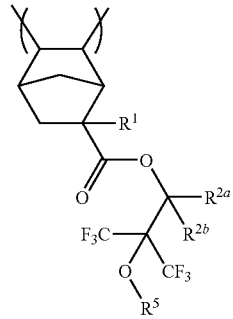 (2f)

Herein $R^1$ is hydrogen, methyl or trifluoromethyl. $R^{2a}$ and $R^{2b}$ are hydrogen or straight, branched or cyclic $C_1$-$C_{15}$ alkyl, $R^{2a}$ and $R^{2b}$ may bond together to form a ring with the carbon atom to which they are attached. $R^5$ is hydrogen, a straight, branched or cyclic $C_1$-$C_{15}$ alkyl or fluoroalkyl, or an acid labile group. $R^6$ is a straight, branched or cyclic $C_1$-$C_{15}$ fluoroalkyl. $R^7$ is an acid labile group.

The straight, branched or cyclic $C_1$-$C_{15}$ alkyl groups represented by $R^{2a}$ and $R^{2b}$ and the rings formed thereby are the same as previous; and the straight, branched or cyclic $C_1$-$C_{15}$ alkyl groups represented by $R^5$ are also the same as previous. The straight, branched or cyclic $C_1$-$C_{15}$ fluoroalkyl groups represented by $R^5$ and $R^6$ are the same as previously described for $R^4$ in formula (1).

The acid labile groups represented by $R^5$ and $R^7$ in formulae (2a) to (2f) may be selected from a variety of such groups. Specifically exemplary acid labile groups include groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

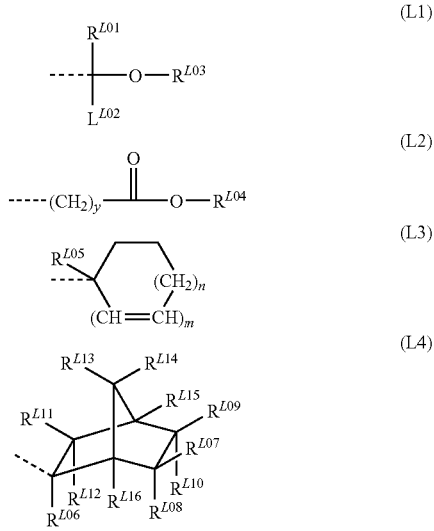

Herein $R^{L01}$ and $R^{L02}$ are hydrogen or straight, branched or cyclic alkyl groups of 1 to 18 carbon atoms, preferably 1 to 10 carbon atoms. $R^{L03}$ is a monovalent hydrocarbon group of 1 to 18 carbon atoms, preferably 1 to 10 carbon atoms, which may contain a heteroatom such as oxygen, examples of which include unsubstituted straight, branched or cyclic alkyl groups and substituted forms of such alkyl groups in which some hydrogen atoms are replaced by hydroxyl, alkoxy, oxo, amino, alkylamino or the like. $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). $R^{L05}$ is an optionally substituted, straight, branched or cyclic $C_1$-$C_{10}$ alkyl group or an optionally substituted $C_6$-$C_{20}$ aryl group. $R^{L06}$ is an optionally substituted, straight, branched or cyclic $C_1$-$C_{10}$ alkyl group or an optionally substituted $C_6$-$C_{20}$ aryl group. $R^{L07}$ to $R^{L16}$ independently represent hydrogen or optionally substituted monovalent hydrocarbon groups of 1 to 15 carbon atoms. Letter y is an integer of 0 to 6, m is equal to 0 or 1, n is equal to 0, 1, 2 or 3, and 2m+n is equal to 2 or 3. The broken line denotes a valence bond.

In formula (L1), exemplary groups of $R^{L01}$ and $R^{L02}$ include methyl, ethyl, propyl, isopropyl, n-butyl, sec-butyl, tert-butyl, cyclopentyl, cyclohexyl, 2-ethylhexyl, n-octyl, and adamantyl. $R^{L03}$ is a monovalent hydrocarbon group of 1 to 18 carbon atoms, preferably 1 to 10 carbon atoms, which may contain a heteroatom such as oxygen, examples of which include unsubstituted straight, branched or cyclic alkyl groups and substituted forms of such alkyl groups in which some hydrogen atoms are replaced by hydroxyl, alkoxy, oxo, amino, alkylamino or the like. Illustrative examples of the straight, branched or cyclic alkyl groups are as exemplified above for $R^{L01}$ and $R^{L02}$, and examples of the substituted alkyl groups are as shown below.

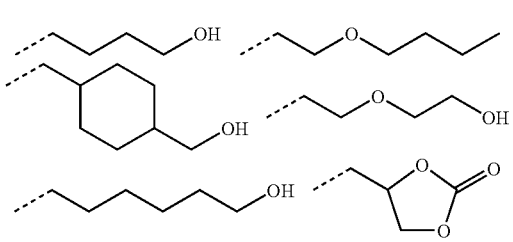

A pair of $R^{L01}$ and $R^{L02}$, $R^{L01}$ and $R^{L03}$, or $R^{L02}$ and $R^{L03}$ may bond together to form a ring with carbon and oxygen atoms to which they are attached. Each of ring-forming $R^{L01}$, $R^{L02}$ and $R^{L03}$ is a straight or branched alkylene group of 1 to 18 carbon atoms, preferably 1 to 10 carbon atoms when they form a ring.

In formula (L2), exemplary tertiary alkyl groups of $R^{L04}$ are tert-butyl, tert-amyl, 1,1-diethylpropyl, 2-cyclopentyl-propan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, 2-ethyl-2-adamantyl, and the like. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl.

In formula (L3), examples of the optionally substituted $C_1$-$C_{10}$ alkyl groups of $R^{L05}$ include straight, branched or cyclic alkyl groups such as methyl, ethyl, propyl, n-butyl, sec-butyl, tert-butyl, tert-amyl, n-pentyl, n-hexyl, cyclopentyl, cyclohexyl, and bicyclo[2.2.1]heptyl, and substituted forms of such groups in which some hydrogen atoms are replaced by hydroxyl, alkoxy, carboxy, alkoxycarbonyl, oxo, amino, alkylamino, cyano, mercapto, alkylthio, sulfo or other groups or in which some methylene groups are replaced by oxygen or sulfur atoms. Examples of optionally substituted $C_6$-$C_{20}$ aryl groups include phenyl, methylphenyl, naphthyl, anthryl, phenanthryl, and pyrenyl.

In formula (L4), examples of optionally substituted, straight, branched or cyclic $C_1$-$C_{10}$ alkyl groups and optionally substituted $C_6$-$C_{20}$ aryl groups of $R^{L06}$ are the same as exemplified for $R^{L05}$. Exemplary monovalent $C_1$-$C_{15}$ hydrocarbon groups of $R^{L07}$ to $R^{L16}$ are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of these groups in which some hydrogen atoms are replaced by hydroxyl, alkoxy, carboxy, alkoxycarbonyl, oxo, amino, alkylamino, cyano, mercapto, alkylthio, sulfo or other groups. Alternatively, two of $R^{L07}$ to $R^{L16}$ may bond together to form a ring with the carbon atom(s) to which they are attached (for example, a pair of $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, $R^{L13}$ and $R^{L14}$, or a similar pair form a ring). Each of $R^{L07}$ to $R^{L16}$ represents a divalent $C_1$-$C_{15}$ hydrocarbon group when they form a ring, examples of which are those exemplified above for the monovalent hydrocarbon groups, with one hydrogen atom being eliminated. Two of $R^{L07}$ to $R^{L16}$ which are attached to vicinal carbon atoms may bond together directly to form a double bond (for example, a pair of $R^{L07}$ and $R^{L09}$, $R^{L09}$ and $R^{L15}$, $R^{L13}$ and $R^{L15}$, or a similar pair).

Of the acid labile groups of formula (L1), the straight and branched ones are exemplified by the following groups.

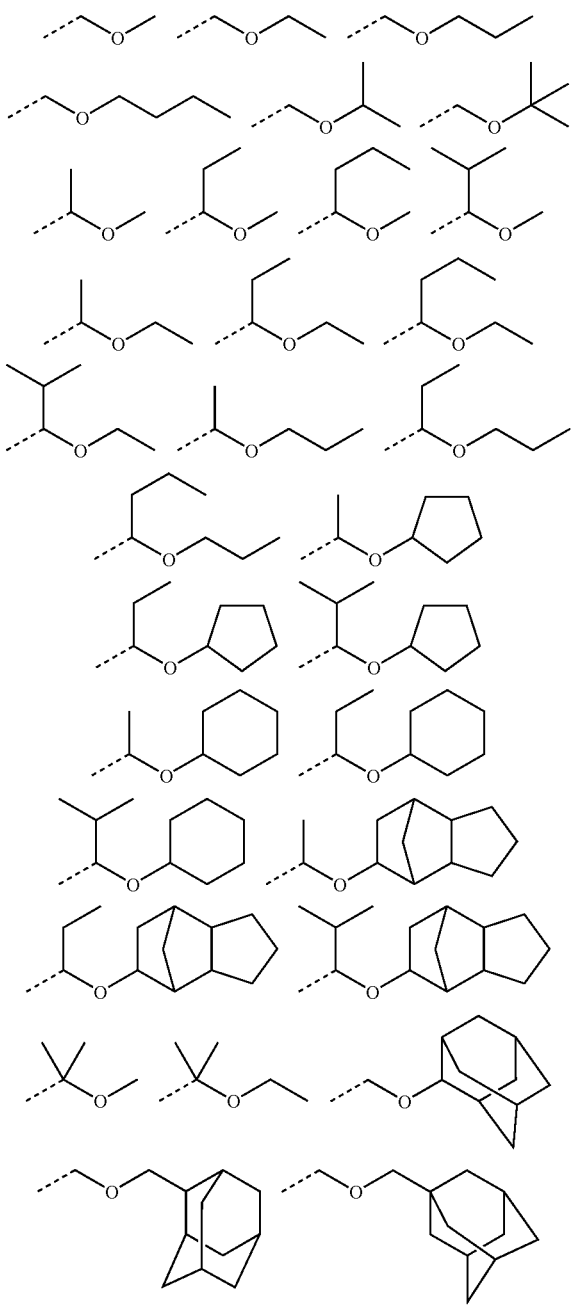

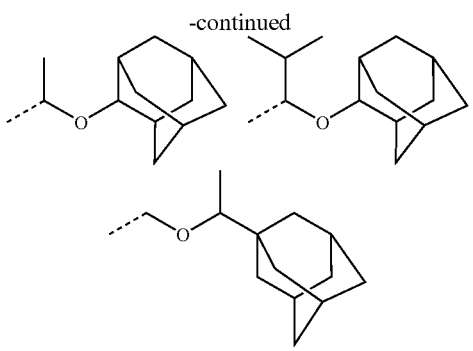

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxy-n-butyl)cyclopentyl, 1-(bicyclo[2.2.1]heptan-2-yl)cyclopentyl, 1-(7-oxabicyclo[2.2.1]heptan-2-yl)cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl.

Of the acid labile groups of formula (L4), those groups of the following formulae (L4-1) to (L4-4) are preferred.

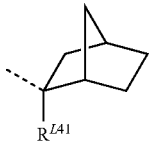 (L4-1)

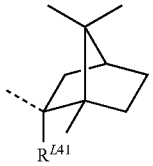 (L4-2)

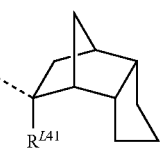 (L4-3)

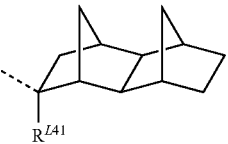 (L4-4)

In formulas (L4-1) to (L4-4), the broken line denotes a bonding site and direction. $R^{L41}$ is each independently a monovalent hydrocarbon group, typically a straight, branched or cyclic $C_1$-$C_{10}$ alkyl group, such as methyl, ethyl, propyl, isopropyl, n-butyl, sec-butyl, tert-butyl, tert-amyl, n-pentyl, n-hexyl, cyclopentyl and cyclohexyl.

For formulas (L4-1) to (L4-4), there can exist enantiomers and diastereomers. Each of formulae (L4-1) to (L4-4) collectively represents all such stereoisomers. Such stereoisomers may be used alone or in admixture.

For example, the general formula (L4-3) represents one or a mixture of two selected from groups having the following general formulas (L4-3-1) and (L4-3-2).

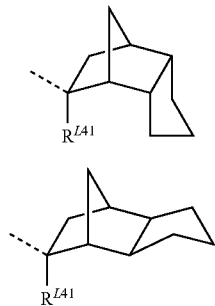

Note that $R^{L41}$ is as defined above.

Similarly, the general formula (L4-4) represents one or a mixture of two or more selected from groups having the following general formulas (L4-4-1) to (L4-4-4).

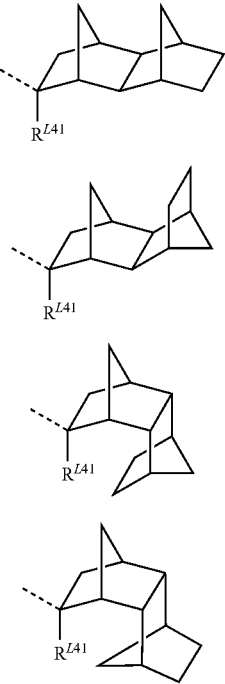

Note that $R^{L41}$ is as defined above.

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1]heptane ring, which ensures high reactivity for acid catalyzed elimination reaction (see JP-A 2000-336121). In preparing these monomers having a tertiary exo-alkyl group of bicyclo[2.2.1]heptane structure as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

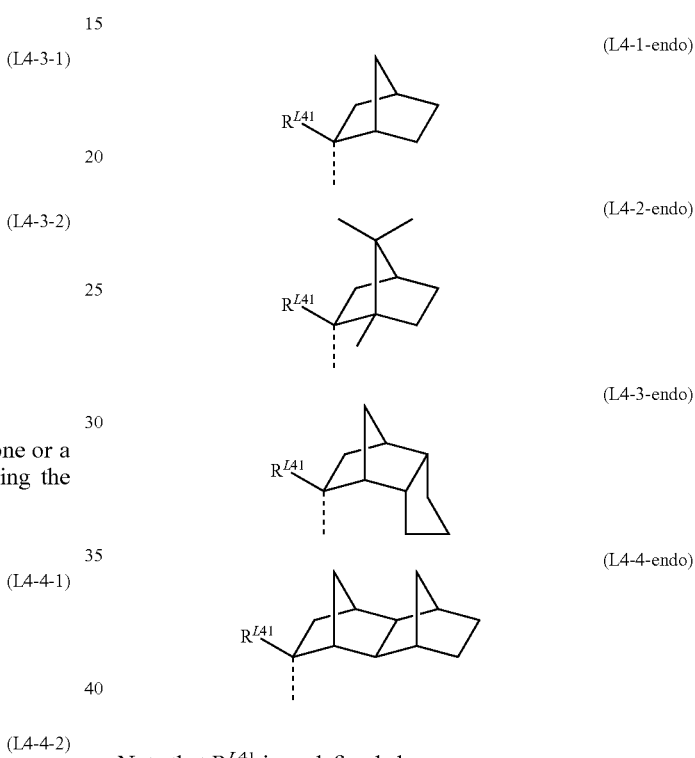

Note that $R^{L41}$ is as defined above.

Illustrative examples of the acid labile group of formula (L4) are given below.

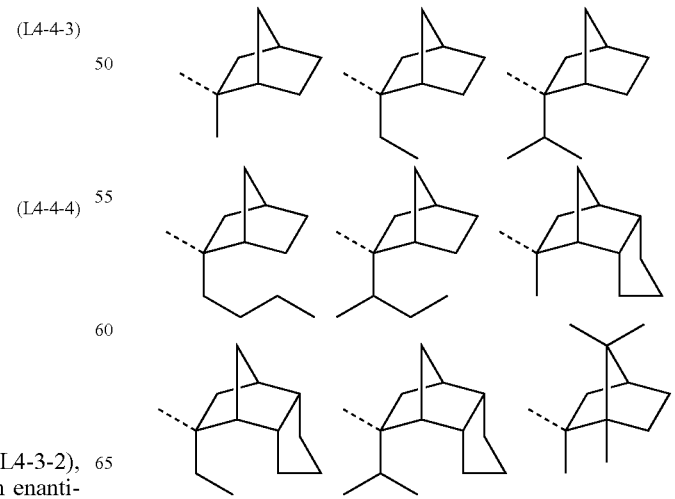

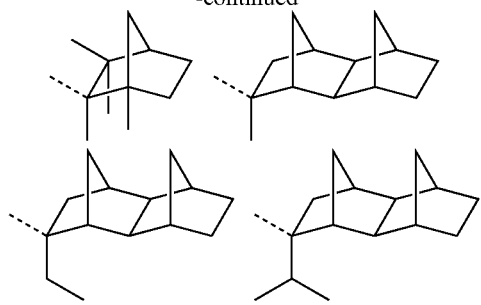
Examples of the tertiary $C_4$-$C_{20}$ alkyl groups, trialkylsilyl groups in which each alkyl moiety has 1 to 6 carbon atoms, and $C_4$-$C_{20}$ oxoalkyl groups, represented by $R^5$ and $R^7$, are as exemplified for $R^{L04}$ and the like.
Illustrative examples of the recurring units having formulae (2a) to (2f) are given below, but not limited thereto.
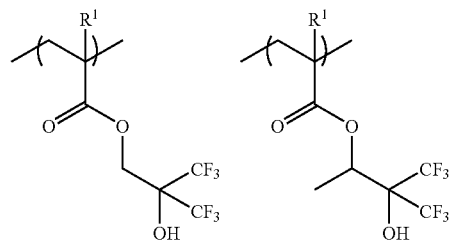
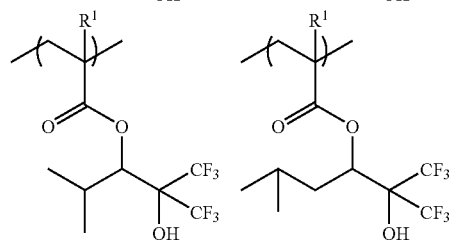
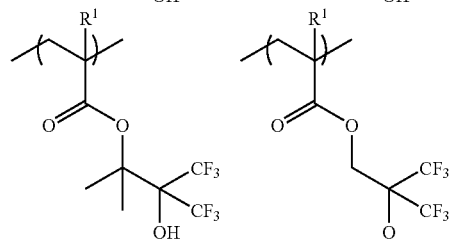
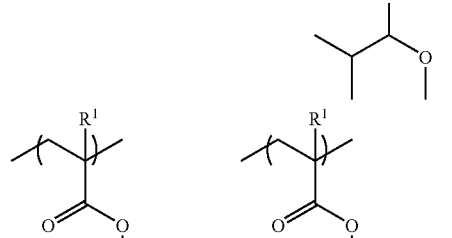
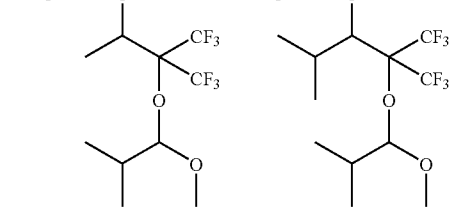
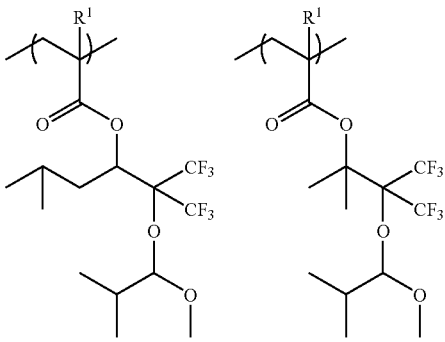
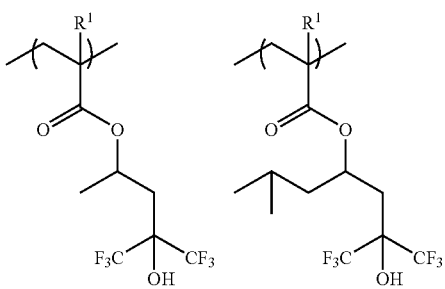
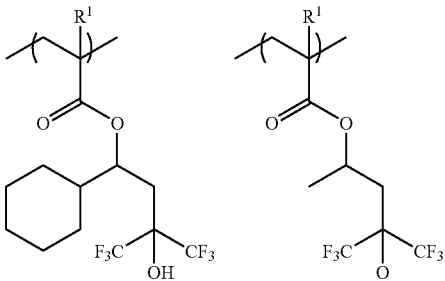
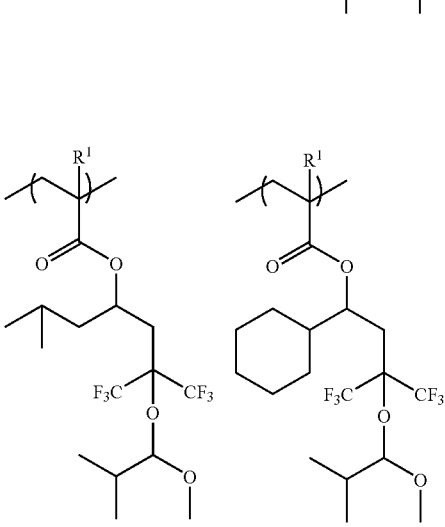

-continued

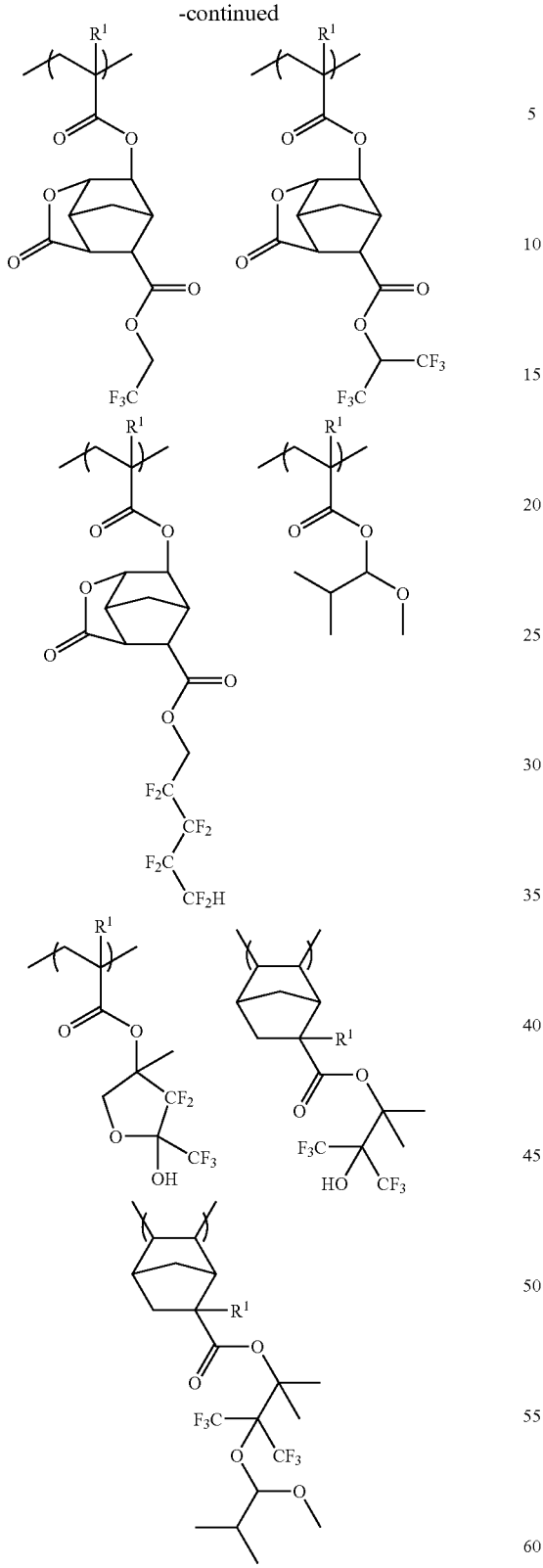

Note that $R^1$ is as defined above.

Although the polymer comprising recurring units of formula (1) in combination with recurring units of formulae (2a) to (2f) exerts satisfactory performance as the resist additive, recurring units of one or more types selected from formulae (6a) to (6e), (7a) to (7e), (8a) to (8c), and (9a) to (9c) may be further incorporated therein for the purposes of imparting further water repellency and water slip, and controlling alkaline solubility and developer affinity.

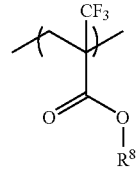
(6a)

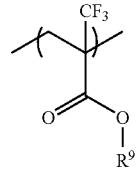
(6b)

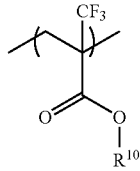
(6c)

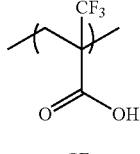
(6d)

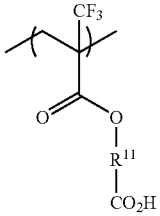
(6e)

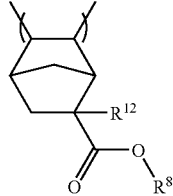
(7a)

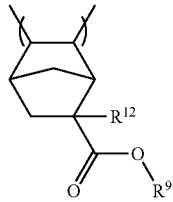
(7b)

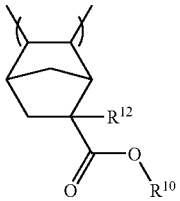
(7c)

-continued (7d) 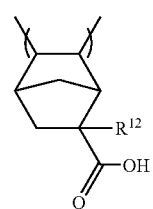

(7e) 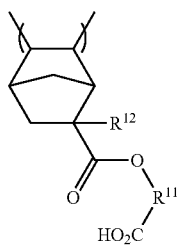

(8a) 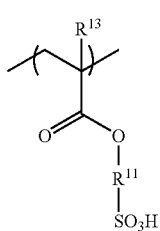

(8b) 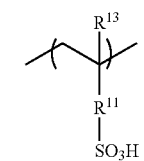

(8c) 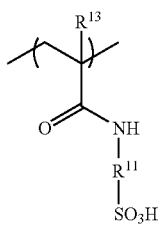

(9a) 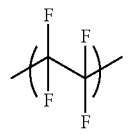

(9b) 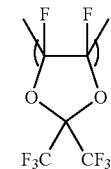

(9c) 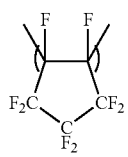

Herein $R^8$ is a $C_1$-$C_{15}$ alkyl or fluoroalkyl group, $R^9$ is an adhesive group, $R^{10}$ is an acid labile group, $R^{11}$ is a single bond or divalent $C_1$-$C_{15}$ organic group, and $R^{12}$ and $R^{13}$ each are hydrogen, methyl or trifluoromethyl.

Examples of the $C_1$-$C_{15}$ alkyl group represented by $R^8$ are the same as illustrated for $R^{2a}$ and $R^{2b}$ in formula (1). Examples of the $C_1$-$C_{15}$ fluoroalkyl group represented by $R^8$ are the same as illustrated for $R^4$ in formula (1).

The adhesive group represented by $R^9$ may be selected from a variety of such groups, typically those groups shown below.

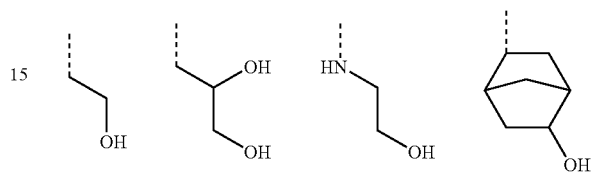

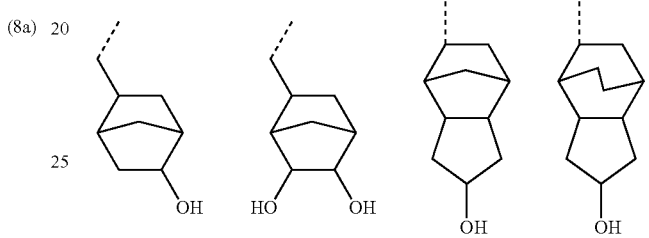

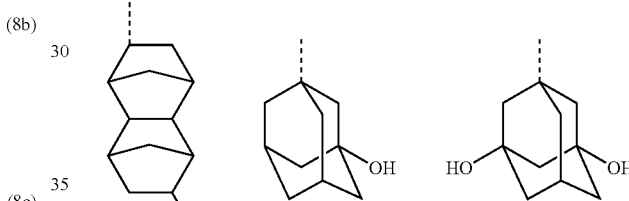

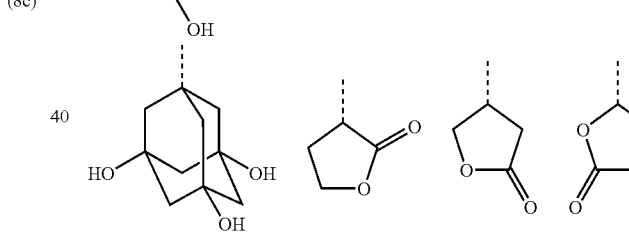

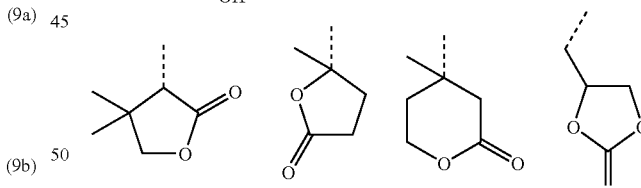

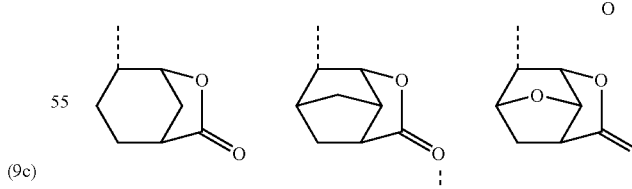

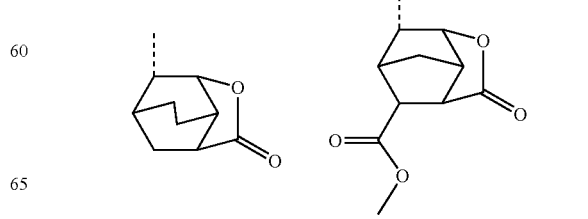

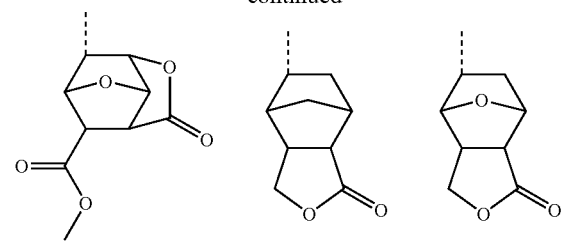
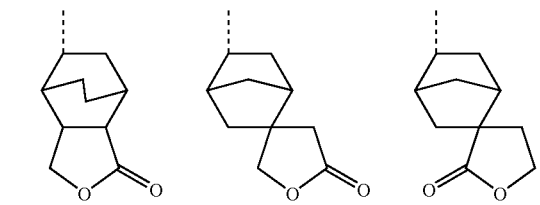
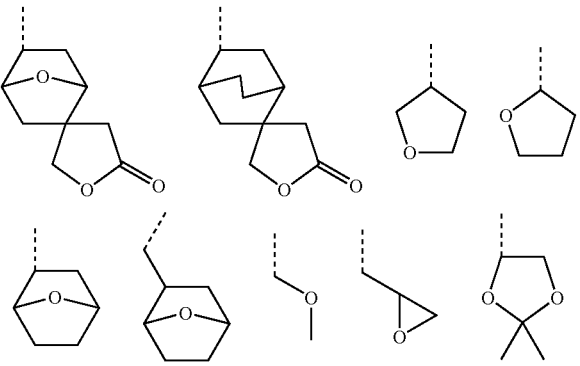
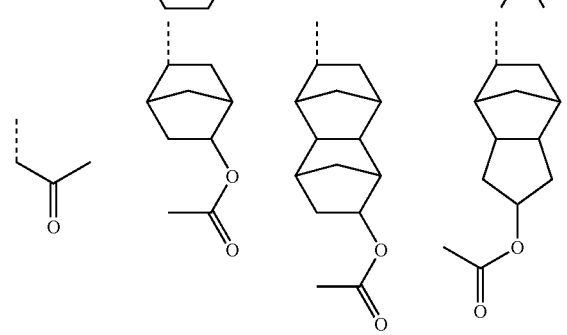
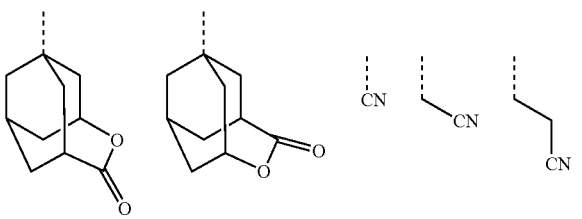
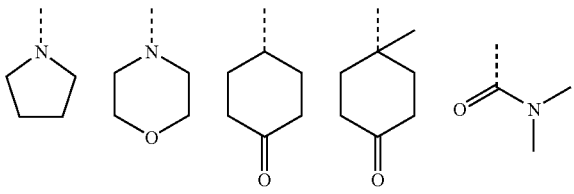
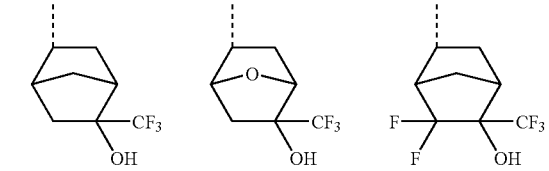

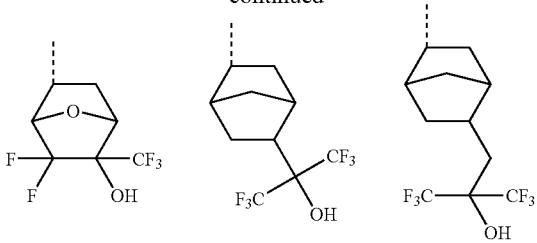
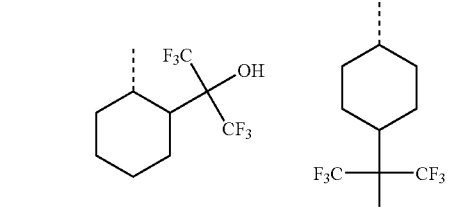
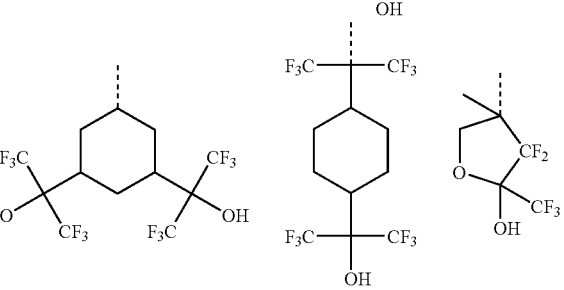

Herein, the broken line designates a valence bond.

The acid labile group represented by $R^{10}$ may be selected from those groups illustrated for $R^5$ and $R^7$.

Suitable divalent $C_1$-$C_{15}$ organic groups represented by $R^{11}$ include alkyl groups as exemplified for $R^{2a}$ and $R^{2b}$ in formula (1), with one hydrogen atom eliminated (e.g., methylene and ethylene). Also useful are groups of the following formulae.

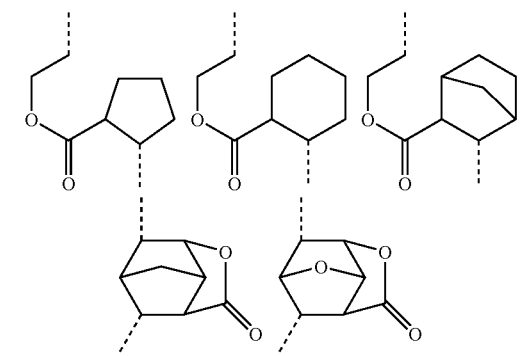

Herein, the broken line designates a valence bond.

Monomer Synthesis

The polymer used as the additive in the resist composition of the invention is characterized by comprising essentially recurring units having formula (1). These recurring units are derived from a monomer (1') which may be synthesized by any well-known methods, for example, the method of US 20070179309 (JP-A 2007-204385).

The monomer (1') corresponding to units of formula (1) may be prepared in accordance with the following reaction scheme, for example, although the process is not limited thereto.

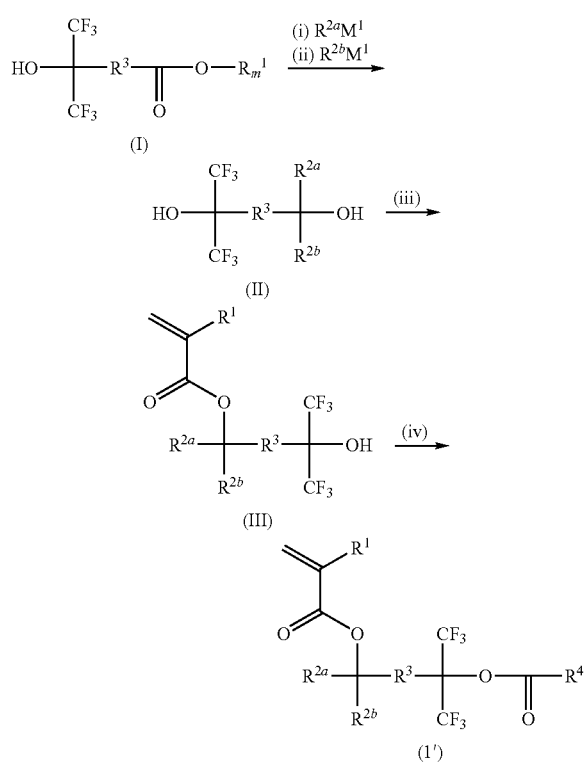

Herein $R^1$, $R^{2a}$, $R^{2b}$, $R^3$, and $R^4$ are as defined above, $Rm^1$ is hydrogen or a straight, branched or cyclic monovalent hydrocarbon group of 1 to 6 carbon atoms, and $M^1$ is one or more elements selected from among Li, Na, K, Mg, Zn, Al, B, and Si which may be optionally substituted.

In the first step, the reactant, 3,3,3-trifluoro-2-trifluoromethyl-2-hydroxypropionic acid derivative (I) is reacted with reducing agents or organometallic reagents ($R^{2a}M^1$ and $R^{2b}M^1$) to form a fluoroalcohol (II).

Examples of $Rm^1$ include hydrogen, methyl, ethyl, n-propyl, isopropyl, n-butyl, sec-butyl, tert-butyl, cyclopentyl and cyclohexyl.

Examples of the reducing agents or organometallic reagents ($R^{2a}M^1$ and $R^{2b}M^1$) include complex hydrides such as sodium borohydride, lithium borohydride, potassium borohydride, calcium borohydride, sodium aluminum hydride, lithium aluminum hydride, lithium triethylborohydride, lithium tri-s-butylborohydride, and potassium tri-s-butyl-borohydride, and alkoxy or alkyl derivatives thereof; organolithium reagents such as methyllithium and n-butyllithium; Grignard reagents such as methylmagnesium chloride, ethylmagnesium chloride, isopropylmagnesium chloride, and 1,4-bis(chloromagnesio)butane; organozinc reagents such as dimethylzinc; and triethylsilane.

Although the amount of reducing agent or organometallic reagent used varies with reaction conditions, it is desirably in a range of 2.0 to 5.0 moles and more preferably 2.0 to 3.0 moles per mole of the reactant, fluorine compound (I).

Suitable solvents include ethers such as tetrahydrofuran, diethyl ether, di-n-butyl ether, and 1,4-dioxane; hydrocarbons such as n-hexane, n-heptane, benzene, toluene, xylene, and cumene; alcohols such as methanol, ethanol, isopropyl alcohol, and tert-butyl alcohol; and aprotic polar solvents such as dimethyl sulfoxide (DMSO), N,N-dimethylformamide (DMF), and acetonitrile. These solvents may be used alone or in admixture.

The reaction temperature and time widely vary depending on other reaction conditions. Where a Grignard reagent is used as the organometallic reagent, for example, the reaction temperature is in a range of 0 to 100° C., preferably 20 to 70° C. It is desirable from the standpoint of yield that the reaction time is determined so as to drive the reaction to completion by monitoring the reaction process by gas chromatography (GC) or silica gel thin-layer chromatography (TLC). Usually, the reaction time is about 0.5 to 10 hours. From the reaction mixture, the desired fluoroalcohol compound (II) is recovered through an ordinary aqueous workup. If necessary, the compound may be purified by a standard technique such as distillation or recrystallization.

In the second step, the fluoroalcohol compound (II) is esterified into a compound (III). The reaction runs readily by any well-known procedure. The preferred esterifying agent is an acid chloride, carboxylic acid or acid anhydride. When an acid chloride is used as the esterifying agent, the reaction may be conducted in a solventless system or in a solvent such as methylene chloride, toluene or hexane, by sequentially or simultaneously adding alcohol (II), a corresponding acid chloride (e.g., methacrylic acid chloride or α-trifluoromethylacrylic acid chloride), and a base (e.g., triethylamine, pyridine or 4-dimethylaminopyridine), and optionally cooling or heating the reaction system.

When a carboxylic acid is used as the esterifying agent, the reaction may be conducted in a solvent such as toluene or hexane, by adding alcohol (II), a corresponding carboxylic acid (e.g., methacrylic acid or α-trifluoromethyl-acrylic acid), and a mineral acid (e.g., hydrochloric acid, sulfuric acid, nitric acid or perchloric acid), or an organic acid (e.g., p-toluenesulfonic acid, benzenesulfonic acid or trifluoroacetic acid), heating the contents, and optionally removing the water formed during reaction from the system. Alternatively, the reaction may be conducted in a solventless system or in a solvent such as toluene or hexane, by sequentially or simultaneously adding alcohol (II), an aliphatic sulfonyl chloride (e.g., methanesulfonyl chloride) or aromatic sulfonyl chloride (e.g., p-toluenesulfonyl chloride), an acid anhydride (e.g., acetic anhydride or trifluoroacetic anhydride), and optionally a base (e.g., triethylamine, pyridine or 4-dimethylaminopyridine), and optionally cooling or heating the reaction system.

When an acid anhydride is used as the esterifying agent, the reaction may be conducted in a solventless system or in a solvent such as methylene chloride, toluene or hexane, by sequentially or simultaneously adding alcohol (II), a corresponding acid anhydride (e.g., methacrylic anhydride or α-trifluoromethylacrylic anhydride), and a mineral acid (e.g., hydrochloric acid, sulfuric acid, nitric acid or perchloric acid), an organic acid (e.g., p-toluenesulfonic acid, benzenesulfonic acid or trifluoroacetic acid) or a base (e.g., triethylamine, pyridine or 4-dimethylaminopyridine), and optionally cooling or heating the reaction system. Where the acid anhydride is used as the esterifying agent, a mixed acid anhydride consisting of a carboxylic acid (e.g., formic acid, acetic acid or trifluoroacetic acid), a sulfonic acid (e.g., methanesulfonic acid or p-toluenesulfonic acid), and a phenol (e.g., phenol or p-nitrophenol) or the like may be used.

The third step is to esterify the hydroxyl group of the resulting methacrylate (III) to provide the desired monomer (1). This esterifying reaction may be done by the same procedure as in the second step.

Synthesis of Polymer

For convenience of description, the polymer comprising recurring units of formula (1) and recurring units of formulae (2a) to (2f) is referred to as polymer P1, hereinafter.

The polymer P1 may be synthesized by general polymerization processes including radical polymerization using initiators such as 2,2'-azobisisobutyronitrile (AIBN), and ionic (or anionic) polymerization using alkyllithium or the like. The polymerization may be carried out by its standard technique. Preferably the polymer P1 is synthesized by radical polymerization while the polymerization conditions may be determined in accordance with the type and amount of initiator, temperature, pressure, concentration, solvent, additives, and the like.

Examples of the radical polymerization initiator used herein include azo compounds such as 2,2'-azobisisobutyronitrile (AIBN), 2,2'-azobis(4-methoxy-2,4-dimethylvaleronitrile), 2,2'-azobis(2,4-dimethylvaleronitrile), 2,2'-azobis(2,4,4-trimethylpentane), and dimethyl 2,2'-azobis(isobutyrate); peroxides such as tert-butylperoxypivalate, lauroyl peroxide, benzoyl peroxide, and tert-butylperoxylaurate; water-soluble polymerization initiators such as potassium persulfate; and redox initiators comprising a peroxide (e.g., potassium persulfate or hydrogen peroxide) combined with a reducing agent (e.g., sodium sulfite). Although the amount of polymerization initiator used may vary with its type and other polymerization conditions, it is generally used in an amount of 0.001 to 10 mol %, and preferably 0.01 to 6 mol % based on the total moles of monomers to be polymerized.

During the synthesis of polymer P1, any known chain transfer agent such as dodecyl mercaptan or 2-mercaptoethanol may be added for molecular weight control purpose. The amount of chain transfer agent added is preferably 0.01 to 10 mol % based on the total moles of monomers to be polymerized.

Polymer P1 may be synthesized by combining suitable monomers selected from polymerizable monomers corresponding to recurring units of formulae (1), (2a) to (2f), (6a) to (6e), (7a) to (7e), (8a) to (8c), and (9a) to (9c), adding an initiator and chain transfer agent to the monomer mixture, and effecting polymerization.

In polymer P1 wherein U11 stands for a total molar number of a monomer corresponding to units of formula (1), U12 stands for a total molar number of monomers corresponding to units of formulae (2a) to (2f), and U13 stands for a total molar number of monomers corresponding to units of formulae (6a) to (6e), (7a) to (7e), (8a) to (8c), and (9a) to (9c), with the proviso that U11+U12+U13=U1 (=100 mol %), values of U11, U12, and U13 are preferably determined so as to meet:

$0 \leq U11/U1 < 1$, more preferably $0.1 \leq U11/U1 \leq 0.7$, even more preferably $0.2 \leq U1/U1 \leq 0.6$, $0 \leq U12/U1 < 1$, more preferably $0.3 \leq U12/U1 \leq 0.9$, even more preferably $0.4 \leq U12/U1 \leq 0.8$, and $0 \leq U13/U1 < 1$, more preferably $0 \leq U13/U1 \leq 0.5$, even more preferably $0 \leq U13/U1 \leq 0.3$.

For polymerization, a solvent may be used if desired. Preferred is the solvent which does not interfere with the desired polymerization reaction. Typical solvents used herein include esters such as ethyl acetate, n-butyl acetate, and γ-butyrolactone; ketones such as acetone, methyl ethyl ketone, and methyl isobutyl ketone; aliphatic or aromatic hydrocarbons such as toluene, xylene and cyclohexane; alcohols such as isopropyl alcohol and ethylene glycol monomethyl ether; and ether solvents such as diethyl ether, dioxane, and tetrahydrofuran, which may be used alone or in admixture. Although the amount of solvent used may vary with the desired degree of polymerization (or molecular weight), the amount of initiator added, and other polymerization conditions such as temperature, it is generally used in such an amount as to provide a concentration of 0.1 to 95% by weight, preferably 5 to 90% by weight of monomers to be polymerized.

Although the temperature of the polymerization reaction may vary with the identity of polymerization initiator or the boiling point of solvent, it is preferably in the range of 20 to 200° C., and more preferably 50 to 140° C. Any desired reactor or vessel may be used for the polymerization reaction.

From the solution or dispersion of the polymer thus synthesized, the organic solvent or water serving as the reaction medium is removed by any well-known techniques. Suitable techniques include, for example, re-precipitation followed by filtration, and heat distillation under vacuum.

Desirably polymer P1 has a weight average molecular weight (Mw) of 1,000 to 500,000, and especially 2,000 to 30,000, as determined by gel permeation chromatography (GPC) using polystyrene standards. This is because a polymer with too low a Mw may be miscible with the resist material or more dissolvable in water whereas too high a Mw may interfere with film formation after spin coating and lead to a decline of alkali solubility.

In polymer P1, $R^5$ in formulae (2a), (2b) and (2f) and $R^{10}$ in formulae (6c) and (7c) may be introduced by post-protection reaction. Specifically, a monomer wherein $R^5$ or $R^{10}$ is hydrogen is previously polymerized to synthesize a precursor polymer. Post-protection reaction is effected on the precursor polymer for substituting acid labile groups $R^5$ or $R^{10}$ for some or all hydroxyl groups on the precursor polymer as shown below.

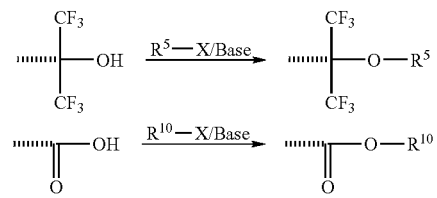

Herein $R^5$ and $R^{10}$ are as defined above.

The desired polymer is obtainable via post-protection reaction by reacting the precursor polymer with a base in an amount of 1 to 2 equivalents relative to the desired degree of substitution of hydroxyl groups, and then with R—X (wherein R is $R^5$ or $R^{10}$ as defined above and X is chlorine, bromine or iodine) in an amount of 1 to 2 equivalents relative to the base.

The post-protection reaction may be effected in a solvent, which is selected from hydrocarbons such as benzene and toluene, and ethers such as dibutyl ether, diethylene glycol diethyl ether, diethylene glycol dimethyl ether, tetrahydrofuran and 1,4-dioxane, alone or in admixture. Suitable bases used herein include, but are not limited to, sodium hydride, n-butyllithium, lithium diisopropylamide, triethylamine, and pyridine.

Resist Composition

Briefly stated, the invention provides a resist composition comprising (A) a polymer P1 comprising recurring units of formula (1), (B) a base polymer having a structure derived from lactone ring, hydroxyl group and/or maleic anhydride, the base polymer becoming soluble in alkaline developer under the action of acid, (C) a compound capable of generating an acid upon exposure to high-energy radiation, and (D) an organic solvent.

Polymer(s) P1 as component (A) is added to the resist composition preferably in a total amount of 0.1 to 50 parts, more preferably 0.5 to 10 parts by weight per 100 parts by weight of the base resin (B). At least 0.1 phr of polymer P1 is effective in improving the receding contact angle with water of photoresist film surface, whereas up to 50 phr of polymer P1 forms a photoresist film having a low dissolution rate in alkaline developer and capable of maintaining the height of a fine pattern formed therein.

Since polymer P1 comprises recurring units of formula (1) which contain a hexafluoroalcohol structure having a protected hydroxyl group, a choice of resin structure makes it possible to tailor any of properties including water repellency, water slip, fat solubility, acid lability, hydrolysis, and alkaline solubility.

When polymer P1 is used in admixture with base resin (B) to form a resist film, layer separation occurs during spin coating such that polymer P1 segregates in a resist film upper layer. The resulting resist film displays improved water repellency and water slip on its surface and prevents water-soluble components from being leached out of the resist material.

The resist composition contains (B) a base resin or polymer which has a structure derived from lactone ring and/or hydroxyl group and/or maleic anhydride and becomes soluble in alkaline developer under the action of acid. The polymers which can serve as the base resin (B) include (meth) acrylates, (α-trifluoromethyl)acrylate/maleic anhydride copolymers, cycloolefin/maleic anhydride alternating copolymers, polynorbornene, cycloolefin ring-opening metathesis polymerization (ROMP) polymers, hydrogenated cycloolefin ROMP polymers, examples of which are described in U.S. Pat. No. 7,537,880 (JP-A 2008-111103, paragraphs [0072] to [0120]). The polymer serving as base resin (B) is not limited to one type and a mixture of two or more polymers may be added. The use of plural polymers allows for easy adjustment of resist properties.

Specifically the base resin used herein includes, but is not limited to, those polymers comprising units of the following formula (R1) and/or (R2) and having a weight in average molecular weight (Mw) of 1,000 to 100,000, especially 3,000 to 30,000, as measured by GPC versus polystyrene standards.

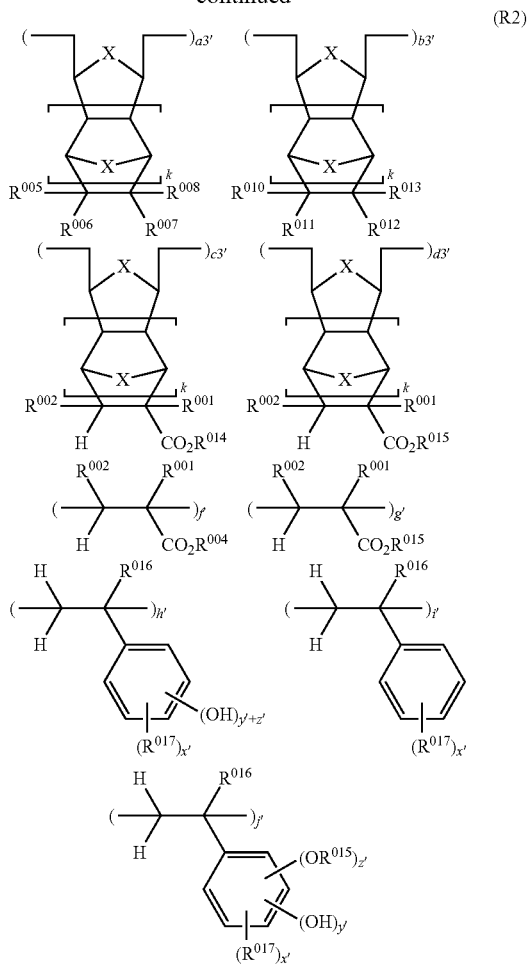

Herein, $R^{001}$ is hydrogen, methyl or $CH_2CO_2R^{003}$.

$R^{002}$ is hydrogen, methyl or $CO_2R^{003}$.

$R^{003}$ is a straight, branched or cyclic $C_1$-$C_{15}$ alkyl group, examples of which include methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, and butyladamantyl.

$R^{004}$ is hydrogen or a monovalent hydrocarbon group of 1 to 15 carbon atoms having at least one group selected from among fluorinated substituent groups, carboxyl groups and hydroxyl groups. Examples include hydrogen, carboxyethyl, carboxybutyl, carboxycyclopentyl, carboxycyclohexyl, carboxynorbornyl, carboxyadamantyl, hydroxyethyl, hydroxybutyl, hydroxycyclopentyl, hydroxycyclohexyl, hydroxynorbornyl, hydroxyadamantyl, hydroxyhexafluoroisopropylcyclohexyl, and di(hydroxyhexafluoroisopropyl)cyclohexyl.

At least one of $R^{005}$ to $R^{008}$ represents a carboxyl group or a monovalent hydrocarbon group of 1 to 15 carbon atoms having at least one group selected from among fluorinated substituent groups, carboxyl groups and hydroxyl groups while the remaining R's independently represent hydrogen or straight, branched or cyclic $C_1$-$C_{15}$ alkyl groups. Examples of suitable monovalent $C_1$-$C_{15}$ hydrocarbon groups having at least one group selected from among fluorinated substituent groups, carboxyl groups and hydroxyl groups include carboxy, carboxymethyl, carboxyethyl, carboxybutyl, hydroxymethyl, hydroxyethyl, hydroxybutyl, 2-carboxyethoxycarbonyl, 4-carboxybutoxycarbonyl, 2-hydroxyethoxycarbonyl, 4-hydroxybutoxycarbonyl, carboxycyclopentyloxycarbonyl, carboxycyclohexyloxycarbonyl, carboxynorbornyloxycarbonyl, carboxyadamantyloxycarbonyl, hydroxycyclopentyloxycarbonyl, hydroxycyclohexyloxycarbonyl, hydroxynorbornyloxycarbonyl, hydroxyadamantyloxycarbonyl, hydroxyhexafluoroisopropylcyclohexyloxycarbonyl, and di(hydroxyhexafluoroisopropyl)cyclohexyloxycarbonyl. Suitable straight, branched or cyclic $C_1$-$C_{15}$ alkyl groups are as exemplified for $R^{003}$.

Two of $R^{005}$ to $R^{008}$ (for example, a pair of $R^{005}$ and $R^{006}$, or $R^{006}$ and $R^{007}$) may bond together to form a ring with the carbon atom(s) to which they are attached, and in that event, at least one of ring forming $R^{005}$ to $R^{008}$ is a divalent hydrocarbon group of 1 to 15 carbon atoms having at least one group selected from fluorinated substituent groups, carboxyl groups and hydroxyl groups, while the remaining R's are independently single bonds or straight, branched or cyclic $C_1$-$C_{15}$ alkylene groups. Suitable divalent $C_1$-$C_{15}$ hydrocarbon groups having at least one group selected from fluorinated substituent groups, carboxyl groups and hydroxyl groups include those exemplified above as the monovalent hydrocarbon groups having at least one group selected from fluorinated substituent groups, carboxyl groups and hydroxyl groups, with one hydrogen atom eliminated therefrom. Suitable straight, branched or cyclic $C_1$-$C_{15}$ alkylene groups include those groups exemplified for $R^{003}$, with one hydrogen atom eliminated therefrom.

$R^{009}$ is a monovalent hydrocarbon group of 3 to 15 carbon atoms containing a —$CO_2$— partial structure. Examples include 2-oxooxolan-3-yl, 4,4-dimethyl-2-oxooxolan-3-yl, 4-methyl-2-oxooxan-4-yl, 2-oxo-1,3-dioxolan-4-ylmethyl, and 5-methyl-2-oxooxolan-5-yl.

At least one of $R^{010}$ to $R^{013}$ is a monovalent hydrocarbon group of 2 to 15 carbon atoms containing a —$CO_2$— partial structure, while the remaining R's are independently hydrogen atoms or straight, branched or cyclic $C_1$-$C_{15}$ alkyl groups. Illustrative examples of suitable monovalent $C_2$-$C_{15}$ hydrocarbon groups containing a —$CO_2$— partial structure include 2-oxooxolan-3-yloxycarbonyl, 4,4-dimethyl-2-oxooxolan-3-yloxycarbonyl, 4-methyl-2-oxooxan-4-yloxycarbonyl, 2-oxo-1,3-dioxolan-4-ylmethyloxycarbonyl, and 5-methyl-2-oxooxolan-5-yloxycarbonyl. Suitable straight, branched or cyclic $C_1$-$C_{15}$ alkyl groups are as exemplified for $R^{003}$.

Two of $R^{010}$ to $R^{013}$ (for example, a pair of $R^{010}$ and $R^{011}$, or $R^{011}$ and $R^{012}$) may bond together to form a ring with the carbon atom(s) to which they are attached, and in that event, at least one of ring-forming $R^{010}$ to $R^{013}$ is a divalent hydrocarbon group of 1 to 15 carbon atoms containing a —$CO_2$— partial structure, while the remaining R's are independently single bonds or straight, branched or cyclic $C_1$-$C_{15}$ alkylene groups. Illustrative examples of suitable divalent $C_1$-$C_{15}$ hydrocarbon groups containing a —$CO_2$— partial structure include 1-oxo-2-oxapropane-1,3-diyl, 1,3-dioxo-2-oxapropane-1,3-diyl, 1-oxo-2-oxabutane-1,4-diyl, and 1,3-dioxo-2-oxabutane-1,4-diyl, as well as those exemplified as the monovalent hydrocarbon groups containing a —$CO_2$— partial structure, with one hydrogen atom eliminated therefrom. Suitable straight, branched or cyclic $C_1$-$C_{15}$ alkylene groups include those groups exemplified for $R^{003}$, with one hydrogen atom eliminated therefrom.

$R^{014}$ is a polycyclic hydrocarbon group having 7 to 15 carbon atoms or an alkyl group containing such a polycyclic hydrocarbon group. Examples include norbornyl, bicyclo[3.3.1]nonyl, tricyclo[5.2.1.0$^{2.6}$]decyl, adamantyl, ethyladamantyl, butyladamantyl, norbornylmethyl, and adamantylmethyl.

$R^{015}$ is an acid labile group, examples of which are described above.

$R^{016}$ is hydrogen or methyl.

$R^{017}$ is a straight, branched or cyclic $C_1$-$C_8$ alkyl group, examples of which include methyl, ethyl, propyl, isopropyl, n-butyl, sec-butyl, tert-butyl, tert-amyl, n-pentyl, n-hexyl, cyclopentyl and cyclohexyl.

X is $CH_2$ or an oxygen atom. Letter k is 0 or 1.

In formulae (R1) and (R2), letters a1', a2', a3', b1', b2', b3', c1', c2', c3', d1', d2', d3', and e' are numbers from 0 to less than 1, satisfying a1'+a2'+a3'+b1'+b2'+b3'+c1'+c2'+c3'+d1'+d2'+d3'+e'=1; f', g', h', i', and j' are numbers from 0 to less than 1, satisfying f'+g'+h'+i'+j'=1; x', y' and z' are each an integer of 0 to 3, satisfying $1 \leq x'+y'+z' \leq 5$ and $1 \leq y'+z' \leq 3$.

Photoacid Generator

In order that the resist composition function as a chemically amplified positive resist composition, (C) a compound capable of generating an acid upon exposure to high-energy radiation, referred to as "photoacid generator" or PAG, may be compounded. The photoacid generator may be any compound capable of generating an acid upon exposure of high-energy radiation. Suitable photoacid generators include sulfonium salts, iodonium salts, sulfonyldiazomethane, N-sulfonyloxyimide, and oxime-O-sulfonate acid generators. Exemplary acid generators are described in U.S. Pat. No. 7,537,880 (JP-A 2008-111103, paragraphs [0123] to [0138]).

The preferred PAGs are those compounds of the general formula (C)-1.

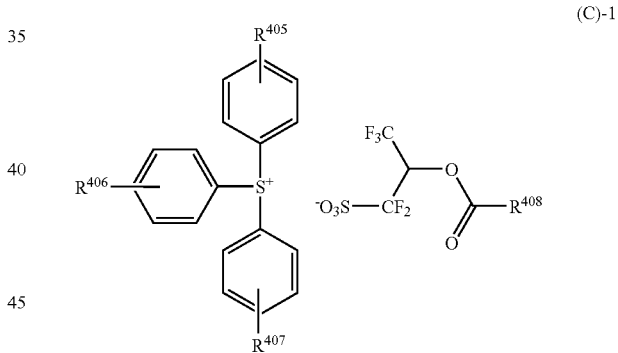

(C)-1

Herein $R^{405}$, $R^{406}$, and $R^{407}$ are each independently hydrogen or a straight, branched or cyclic, monovalent $C_1$-$C_{20}$ hydrocarbon group which may contain a heteroatom, typically an alkyl or alkoxy group. $R^{408}$ is a straight, branched or cyclic, monovalent $C_7$-$C_{30}$ hydrocarbon group which may contain a heteroatom.

Examples of the hydrocarbon groups optionally containing a heteroatom, represented by $R^{405}$, $R^{406}$, and $R^{407}$, include methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, butyladamantyl, and modified forms of the foregoing in which any carbon-carbon bond is separated by a hetero-atomic grouping such as —O—, —S—, —SO—, —$SO_2$—, —NH—, —C(=O)—, —C(=O)O—, or —C(=O)NH—, or any hydrogen atom is replaced by a functional group such as —OH, —$NH_2$, —CHO, or —$CO_2H$. Examples of the straight, branched or cyclic, monovalent $C_7$-$C_{30}$ hydrocarbon groups optionally containing a heteroatom, represented by $R^{408}$, are shown below, but not limited thereto.
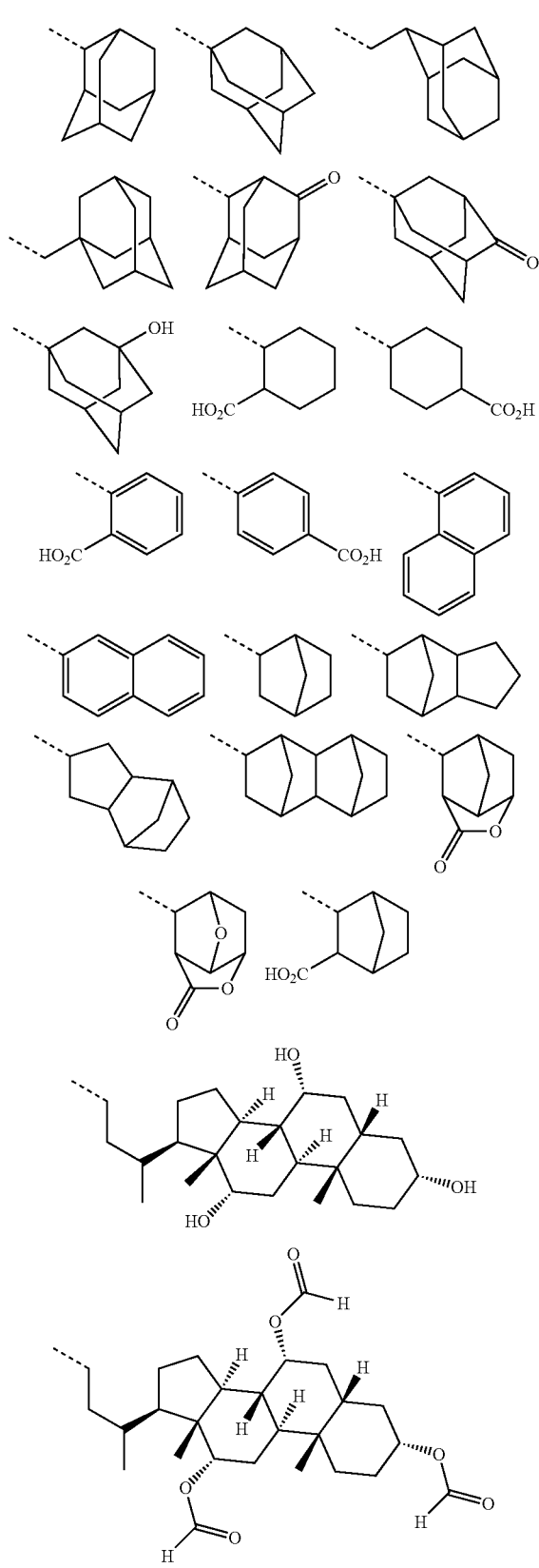
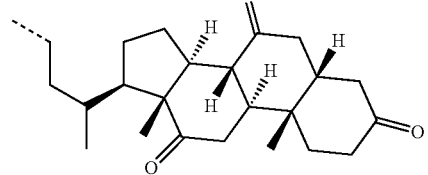
Illustrative examples of acid generators (C)-1 are shown below, but not limited thereto.
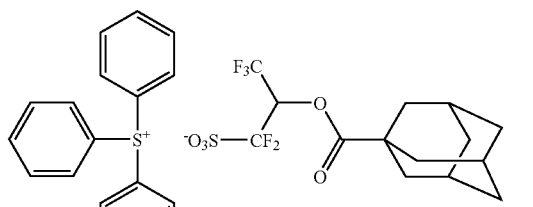
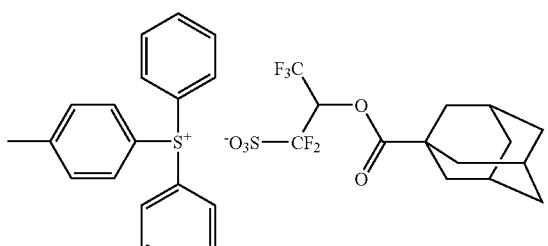
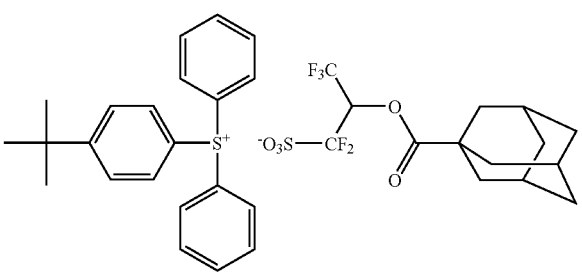
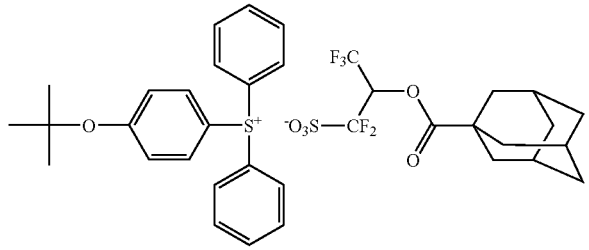
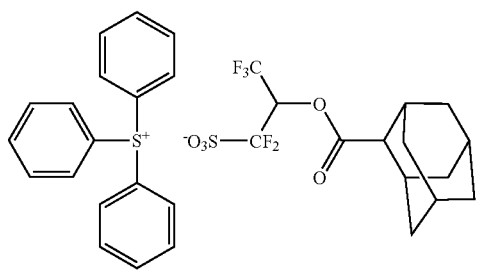

37
-continued
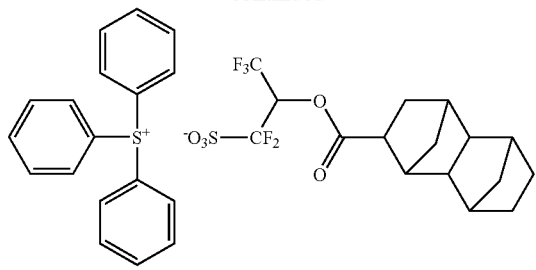
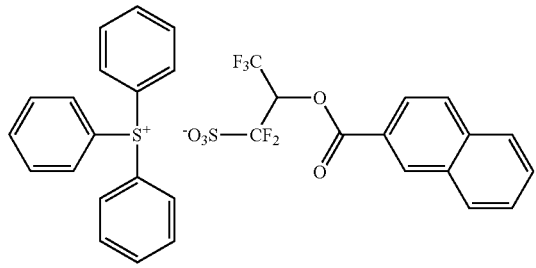
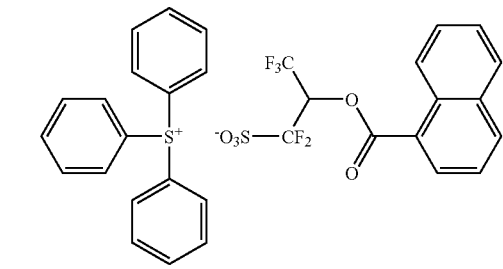
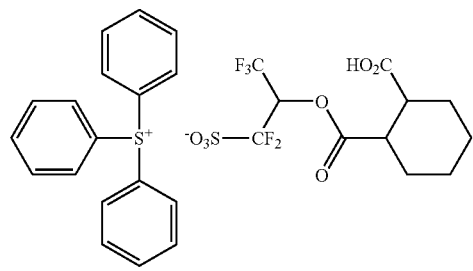
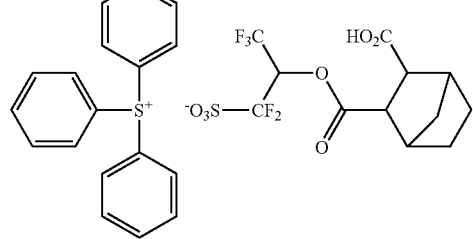
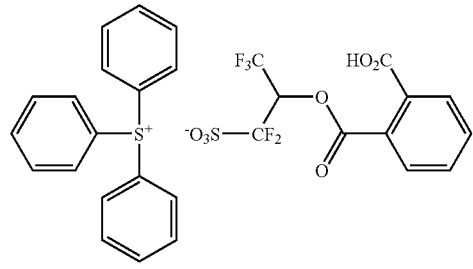
38
-continued
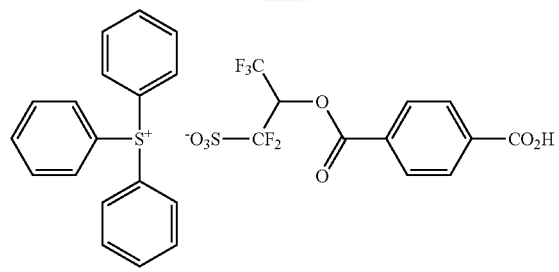
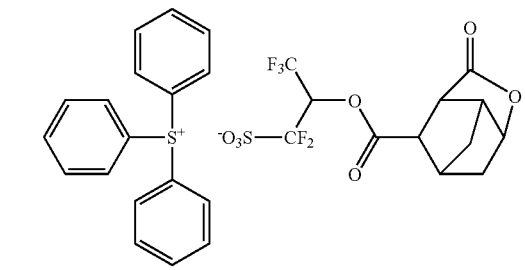
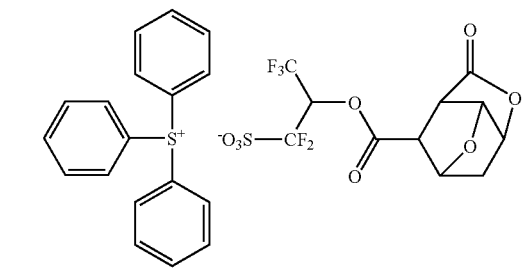
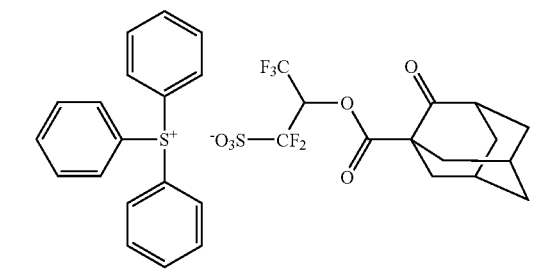
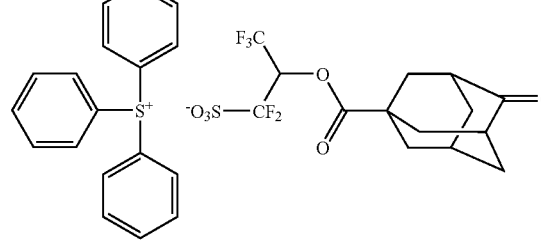
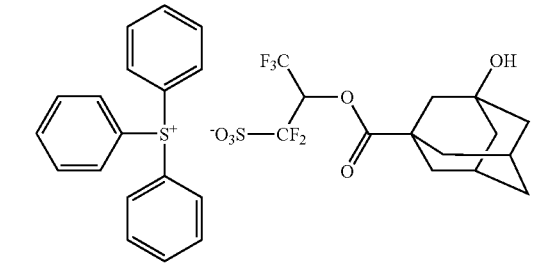

-continued

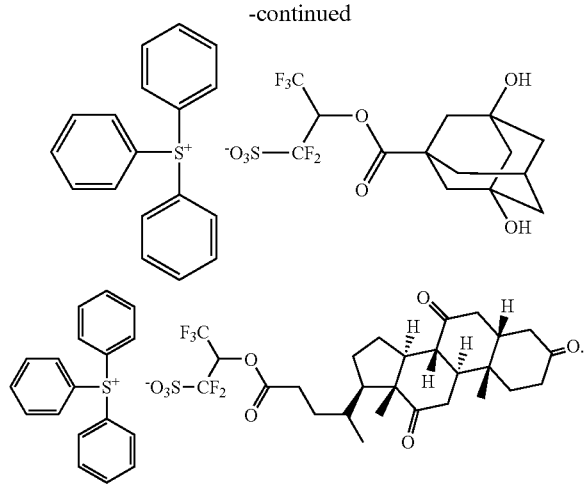

In the resist composition, specifically chemically amplified resist composition, PAG may be added in any desired amount as long as the objects of the invention are not compromised. An appropriate amount of PAG is 0.1 to 10 parts, and more preferably 0.1 to 5 parts by weight per 100 parts by weight of the base resin in the composition. Too large an amount of PAG may give rise to problems of degraded resolution and foreign matter upon development and resist film peeling. The PAG may be used alone or in admixture of two or more. The transmittance of the resist film can be controlled by using a PAG having a low transmittance at the exposure wavelength and adjusting the amount of the PAG added.

It is noted that an acid diffusion controlling function may be provided when two or more PAGs are used in admixture provided that one PAG is an onium salt capable of generating a weak acid. Specifically, in a system using a mixture of a PAG capable of generating a strong acid (e.g., fluorinated sulfonic acid) and an onium salt capable of generating a weak acid (e.g., non-fluorinated sulfonic acid or carboxylic acid), if the strong acid generated from the PAG upon exposure to high-energy radiation collides with the unreacted onium salt having a weak acid anion, then a salt exchange occurs whereby the weak acid is released and an onium salt having a strong acid anion is formed. In this course, the strong acid is exchanged into the weak acid having a low catalysis, incurring apparent deactivation of the acid for enabling to control acid diffusion.

If the PAG capable of generating a strong acid is also an onium salt, an exchange from the strong acid (generated upon exposure to high-energy radiation) to a weak acid as above can take place, but it never happens that the weak acid (generated upon exposure to high-energy radiation) collides with the unreacted onium salt capable of generating a strong acid to induce a salt exchange. This is because of a likelihood of an onium cation forming an ion pair with a stronger acid anion.

An appropriate amount of PAG added is 0.1 to 20 parts, and more preferably 0.1 to 10 parts by weight per 100 parts by weight of the base resin (B) in the composition. As long as PAG is up to 20 phr, the resulting photoresist film has a fully high transmittance and a minimal likelihood of degraded resolution. The PAG may be used alone or in admixture of two or more. The transmittance of the resist film can be controlled by using a PAG having a low transmittance at the exposure wavelength and adjusting the amount of the PAG added.

The resist composition may further comprise one or more of (D) an organic solvent, (E) a basic compound, (F) a dissolution regulator, (G) a surfactant, and (H) an acetylene alcohol derivative.

The organic solvent (D) used herein may be any organic solvent in which polymer P1, the base resin, PAG, and other components are soluble. Exemplary solvents are described in JP-A 2008-111103, paragraph [0144]. The organic solvents may be used alone or in combinations of two or more thereof. An appropriate amount of the organic solvent used is 200 to 3,000 parts, especially 400 to 2,500 parts by weight per 100 parts by weight of the base resin (B). It is recommended to use diethylene glycol dimethyl ether, 1-ethoxy-2-propanol, propylene glycol monomethyl ether acetate (PGMEA), and mixtures thereof because the acid generator is most soluble therein.

As the basic compound (E), nitrogen-containing organic compounds are preferred and may be used alone or in admixture. Those compounds capable of suppressing the rate of diffusion when the acid generated by the acid generator diffuses within the resist film are useful. The inclusion of nitrogen-containing organic compound holds down the rate of acid diffusion within the resist film, resulting in better resolution. In addition, it suppresses changes in sensitivity following exposure and reduces substrate and environment dependence, as well as improving the exposure latitude and the pattern profile.

Suitable nitrogen-containing organic compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, amide, imide acid carbamate derivatives. Illustrative examples are described in JP-A 2008-111103, paragraphs [0149] to [0163]. The basic compound is preferably used in an amount of 0.001 to 2 parts, more preferably 0.01 to 1 part by weight per 100 parts by weight of the base resin (B). At least 0.001 phr achieves the desired addition effect whereas up to 2 phr minimizes the risk of reducing sensitivity.

Tertiary amines are especially preferred as the basic compound. Examples include tri-n-butylamine, tri-n-pentylamine, tri-n-hexylamine, tri-n-octylamine, N,N-dimethylaniline, triethanolamine, triisopropanolamine, tris(2-methoxymethoxyethyl)amine, tris(2-methoxyethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5,1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, tris(2-benzoyloxyethyl)amine, tris[2-(4-methoxybenzoyloxy)ethyl]amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-

(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxy-carbonyl]ethylamine, N,N-bis(2-acetoxyethyl)-2-[(2-oxotetrahydrofuran-3-yl)oxy-carbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

Illustrative examples of the basic compounds include 1-[2-(methoxymethoxy)ethyl]pyrrolidine, 1-[2-(methoxymethoxy)ethyl]piperidine, 4-[2-(methoxymethoxy)ethyl]morpholine, 1-[2-(methoxymethoxy)ethyl]imidazole, 1-[2-(methoxymethoxy)ethyl]benzimidazole, 1-[2-(methoxymethoxy)ethyl]-2-phenylbenzimidazole, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 1-[2-[(2-methoxyethoxy)methoxy]ethyl]imidazole, 1-[2-[(2-methoxyethoxy)methoxy]ethyl]benzimidazole, 1-[2-[(2-methoxyethoxy)methoxy]ethyl]-2-phenylbenzimidazole, 1-[2-[2-(2-methoxyethoxy)ethoxy]ethyl]pyrrolidine, 1-[2-[2-(2-methoxyethoxy)ethoxy]ethyl]piperidine, 4-[2-[2-(2-methoxyethoxy)ethoxy]ethyl]morpholine, 1-[2-[2-(2-methoxyethoxy)ethoxy]ethyl]imidazole, 1-[2-[2-(2-methoxyethoxy)ethoxy]ethyl]benzimidazole, 1-[2-[2-(2-methoxyethoxy)ethoxy]ethyl]-2-phenylbenzimidazole, 1-[2-[2-(2-butoxyethoxy)ethoxy]ethyl]pyrrolidine, 1-[2-[2-(2-butoxyethoxy)ethoxy]ethyl]piperidine, 4-[2-[2-(2-butoxyethoxy)ethoxy]ethyl]morpholine, 1-[2-[2-(2-butoxyethoxy)ethoxy]ethyl]imidazole, 1-[2-[2-(2-butoxyethoxy)ethoxy]ethyl]benzimidazole, 1-[2-[2-(2-butoxyethoxy)ethoxy]ethyl]-2-phenylbenzimidazole, 1-[2-[2-[2-(2-methoxyethoxy)ethoxy]ethoxy]ethyl]pyrrolidine, 1-[2-[2-[2-(2-methoxyethoxy)ethoxy]ethoxy]ethyl]piperidine, 4-[2-[2-[2-(2-methoxyethoxy)ethoxy]ethoxy]ethyl]morpholine, 1-[2-[2-[2-(2-methoxyethoxy)ethoxy]ethoxy]ethyl]imidazole, 1-[2-[2-[2-(2-methoxyethoxy)ethoxy]ethoxy]ethyl]benzimidazole, 1-[2-[2-[2-(2-methoxyethoxy)ethoxy]ethoxy]ethyl]-2-phenylbenzimidazole, 4-[2-[2-[2-(2-butoxyethoxy)ethoxy]ethoxy]ethyl]morpholine, 2-(1-pyrrolidinyl)ethyl acetate, 2-piperidinoethyl acetate, 2-morpholinoethyl acetate, 2-(1-imidazolyl)ethyl acetate, 2-(1-benzimidazolyl)ethyl acetate, 2-(2-phenyl-1-benzimidazolyl)ethyl acetate, 2-methoxyethyl morpholinoacetate, 2-(1-pyrrolidinyl)ethyl 2-methoxyacetate, 2-piperidinoethyl 2-methoxyacetate, 2-morpholinoethyl 2-methoxyacetate, 2-(1-imidazolyl)ethyl 2-methoxyacetate, 2-(1-benzimidazolyl)ethyl 2-methoxyacetate, 2-(2-phenyl-1-benzimidazolyl)ethyl 2-methoxyacetate, 2-(1-pyrrolidinyl)ethyl 2-(2-methoxyethoxy)acetate, 2-piperidinoethyl 2-(2-methoxyethoxy)acetate, 2-morpholinoethyl 2-(2-methoxyethoxy)acetate, 2-(1-imidazolyl)ethyl 2-(2-methoxyethoxy)acetate, 2-(1-benzimidazolyl)ethyl 2-(2-methoxyethoxy)acetate, 2-(2-phenyl-1-benzimidazolyl)ethyl 2-(2-methoxyethoxy)acetate, 2-(1-pyrrolidinyl)ethyl 2-[2-(2-methoxyethoxy)ethoxy]acetate, 2-piperidinoethyl 2-[2-(2-methoxyethoxy)ethoxy]acetate, 2-morpholinoethyl 2-[2-(2-methoxyethoxy)ethoxy]acetate, 2-(1-imidazolyl)ethyl 2-[2-(2-methoxyethoxy)ethoxy]acetate, 2-(1-benzimidazolyl)ethyl 2-[2-(2-methoxyethoxy)ethoxy]-acetate, 2-(2-phenyl-1-benzimidazolyl)ethyl 2-[2-(2-methoxyethoxy)-ethoxy]acetate, 2-morpholinoethyl butyrate, 2-morpholinoethyl hexanoate, 2-morpholinoethyl octanoate, 2-morpholinoethyl decanoate, 2-morpholinoethyl laurate, 2-morpholinoethyl myristate, 2-morpholinoethyl palmitate, 2-morpholinoethyl stearate, 2-morpholinoethyl behenate, 2-morpholinoethyl cholate, 2-morpholinoethyl tris(O-formyl)cholate, 2-morpholinoethyl dehydrocholate, 2-morpholinoethyl cyclopentanecarboxylate, 2-morpholinoethyl cyclohexanecarboxylate, 2-(1-pyrrolidinyl)ethyl 7-oxanorbornane-2-carboxylate, 2-piperidinoethyl 7-oxanorbornane-2-carboxylate, 2-morpholinoethyl 7-oxanorbornane-2-carboxylate, 2-(1-imidazolyl)ethyl 7-oxanorbornane-2-carboxylate, 2-(1-benzimidazolyl)ethyl 7-oxanorbornane-2-carboxylate, 2-(2-phenyl-1-benzimidazolyl)ethyl 7-oxanorbornane-2-carboxylate, 2-morpholinoethyl adamantanecarboxylate, 2-(1-pyrrolidinyl)ethyl formate, 2-piperidinoethyl propionate, 2-morpholinoethyl acetoxyacetate, 2-(1-pyrrolidinyl)ethyl methoxyacetate, 2-(1-pyrrolidinyl)ethyl benzoate, 2-piperidinoethyl benzoate, 2-morpholinoethyl benzoate, 2-(1-imidazolyl)ethyl benzoate, 2-(1-benzimidazolyl)ethyl benzoate, 2-(2-phenyl-1-benzimidazolyl)ethyl benzoate, 2-(1-pyrrolidinyl)ethyl 4-methoxybenzoate, 2-piperidinoethyl 4-methoxybenzoate, 2-morpholinoethyl 4-methoxybenzoate, 2-(1-imidazolyl)ethyl 4-methoxybenzoate, 2-(1-benzimidazolyl)ethyl 4-methoxybenzoate, 2-(2-phenyl-1-benzimidazolyl)ethyl 4-methoxybenzoate, 2-(1-pyrrolidinyl)ethyl 4-phenylbenzoate, 2-piperidinoethyl 4-phenylbenzoate, 2-morpholinoethyl 4-phenylbenzoate, 2-(1-imidazolyl)ethyl 4-phenylbenzoate, 2-(1-benzimidazolyl)ethyl 4-phenylbenzoate, 2-(2-phenyl-1-benzimidazolyl)ethyl 4-phenylbenzoate, 2-(1-pyrrolidinyl)ethyl 1-naphthalenecarboxylate, 2-piperidinoethyl 1-naphthalenecarboxylate, 2-morpholinoethyl 1-naphthalenecarboxylate, 2-(1-imidazolyl)ethyl 1-naphthalenecarboxylate, 2-(1-benzimidazolyl)ethyl 1-naphthalenecarboxylate, 2-(2-phenyl-1-benzimidazolyl)ethyl 1-naphthalenecarboxylate, 2-(1-pyrrolidinyl)ethyl 2-naphthalenecarboxylate, 2-piperidinoethyl 2-naphthalenecarboxylate, 2-morpholinoethyl 2-naphthalenecarboxylate, 2-(1-imidazolyl)ethyl 2-naphthalenecarboxylate, 2-(1-benzimidazolyl)ethyl 2-naphthalenecarboxylate, 2-(2-phenyl-1-benzimidazolyl)ethyl 2-naphthalenecarboxylate, 4-[2-(methoxycarbonyloxy)ethyl]morpholine, 1-[2-(t- butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino) propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl) propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, etc.

The dissolution regulator or inhibitor (F) which can be added to the resist composition is a compound having on the molecule at least two phenolic hydroxyl groups which are protected with an acid labile group, or a compound having on the molecule at least one carboxyl group which is protected with an acid labile group. Exemplary regulators are described in JP-A 2008-122932, paragraphs [0155] to [0178].

Optionally, the resist composition may further comprise (G) a surfactant which is commonly used for facilitating the coating operation. Exemplary surfactants are described in JP-A 2008-111103, paragraph [0166].

Optionally, the resist composition may further comprise (H) an acetylene alcohol derivative. Exemplary compounds are described in JP-A 2008-122932, paragraphs [0180] to [0181].

Pattern Forming Process

It is now described how to form a pattern using the resist composition of the invention. A pattern may be formed from the resist composition of the invention using any well-known lithography process. The preferred method includes at least the steps of forming a photoresist coating on a substrate, exposing it to high-energy radiation, and developing it with a developer.

The resist composition is applied onto a substrate, typically a silicon wafer by a suitable coating technique such as spin coating. The coating is prebaked on a hot plate at a temperature of 60 to 150° C. for 1 to 10 minutes, preferably 80 to 140° C. for 1 to 5 minutes, to form a photoresist film of 0.1 to 2.0 μm thick. It is noted in conjunction with spin coating that if the resist composition is coated onto the surface of a substrate which has been wetted with the resist solvent or a solution miscible with the resist solvent, then the amount of the resist composition dispensed can be reduced (see JP-A 9-246173).

A patterning mask having the desired pattern is then placed over the photoresist film, and the film exposed through the mask to an electron beam or to high-energy radiation such as deep-UV, excimer laser or x-ray in a dose of 1 to 200 mJ/cm$^2$, and preferably 10 to 100 mJ/cm$^2$. The high-energy radiation used herein preferably has a wavelength in the range of 180 to 250 nm.

Light exposure may be dry exposure in air or nitrogen atmosphere, EB or EUV exposure in vacuum, or immersion lithography of providing a liquid, typically water between the photoresist film and the projection lens.

The immersion lithography involves prebaking a resist film and exposing the resist film to light through a projection lens, with pure water or similar liquid interposed between the resist film and the projection lens. Since this allows projection lenses to be designed to a NA of 1.0 or higher, formation of finer patterns is possible. The immersion lithography is important for the ArF lithography to survive to the 45-nm node. The liquid used herein may be a liquid with a refractive index of at least 1 which is highly transparent at the exposure wavelength, typically pure water or alkane.

The photoresist film formed from the resist composition of the invention has such barrier properties to water that it may inhibit resist components from being leached out in water and as a consequence, eliminate a need for a protective coating in immersion lithography and reduce the cost associated with protective coating formation or the like. The photoresist film has so high a receding contact angle with water that few liquid droplets may be left on the surface of the photoresist film after immersion lithography scanning, minimizing pattern formation failures induced by liquid droplets left on the film surface.

In another version of immersion lithography, a protective coating may be formed on top of the resist film. The protective coatings used in the immersion lithography include those of the solvent strippable type and the developer dissolvable type. The protective coatings of the developer dissolvable type that can be stripped during development of a photoresist film are advantageous because the process becomes simple.

The resist protective coating used in the immersion lithography may be formed from a coating solution, for example, a topcoat solution of a polymer having acidic units such as 1,1,1,3,3,3-hexafluoro-2-propanol, carboxyl or sulfo groups which is insoluble in water and soluble in an alkaline developer liquid, in a solvent selected from alcohols of at least 4 carbon atoms, ethers of 8 to 12 carbon atoms, and mixtures thereof. The resist protective coating is not limited thereto.

The resist protective coating may be formed by spin coating a topcoat solution onto a prebaked photoresist film, and prebaking on a hot plate at 50 to 150° C. for 1 to 10 minutes, preferably at 70 to 140° C. for 1 to 5 minutes. Preferably the protective coating has a thickness in the range of 10 to 500 nm. As in the case of resist compositions, the amount of the protective coating material dispensed in forming a protective coating by spin coating may be reduced by previously wetting the resist film surface with a suitable solvent and applying the protective coating material thereto.

After exposure to high-energy radiation through a photomask, the resist film is post-exposure baked (PEB) on a hot plate at 60 to 150° C. for 1 to 5 minutes, and preferably at 80 to 140° C. for 1 to 3 minutes.

Where a resist protective coating is used, sometimes water is left on the protective coating prior to PEB. If PEB is performed in the presence of residual water, water can penetrate through the protective coating to suck up the acid in the resist during PEB, impeding pattern formation. To fully remove the water on the protective coating prior to PEB, the water on the protective coating should be dried or recovered by suitable means, for example, spin drying, purging the protective coating surface with dry air or nitrogen, or optimizing the shape of a water recovery nozzle on the relevant stage or a water recovery process.

After exposure, development is carried out using as the developer an aqueous alkaline solution, such as a 0.1 to 5 wt %, preferably 2 to 3 wt %, aqueous solution of tetramethylammonium hydroxide (TMAH), this being done by a conventional method such as dip, puddle, or spray development for a period of 10 to 300 seconds, and preferably 0.5 to 2 minutes. A typical developer is a 2.38 wt % TMAH aqueous solution. These steps result in the formation of the desired pattern on the substrate.

Where polymer P1 is used as an additive to a resist material for use with mask blanks, a resist solution is prepared by adding polymer P1 to any one of the aforementioned base resins and dissolving them in an organic solvent. The resist solution is coated on a mask blank substrate of $SiO_2$, Cr, CrO, CrN, MoSi or the like. By further forming a SOG film and an organic undercoat film between the photoresist and the blank substrate, there is provided a three-layer structure which is also acceptable herein.

As the base resin of the resist composition for use with mask blanks, novolac resins and hydroxystyrene are often used. Those resins in which alkali soluble hydroxyl groups are substituted by acid labile groups are used for positive resists while these resins in combination with crosslinking agents are used for negative resists. Base polymers which can be used herein include copolymers of hydroxystyrene with one or more of (meth)acrylic derivatives, styrene, vinyl naphthalene, vinyl anthracene, vinyl pyrene, hydroxyvinyl naphthalene, hydroxyvinyl anthracene, indene, hydroxyindene, acenaphthylene, and norbornadiene.

Once the resist coating is formed, the structure is exposed to EB in vacuum using an EB image-writing system. The exposure is followed by post-exposure baking (PEB) and development in an alkaline developer for 10 to 300 seconds, thereby forming a pattern.

EXAMPLE

Examples are given below by way of illustration and not by way of limitation. The abbreviations Mw and Mn are weight and number average molecular weights, respectively, as measured by gel permeation chromatography (GPC) using polystyrene standards, and Mw/Mn is a polydispersity index. Me stands for methyl, and PGMEA for propylene glycol monomethyl ether acetate.

Monomer Synthesis Example 1

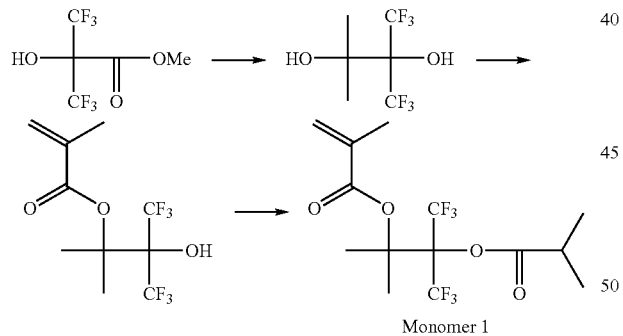

Synthesis Example 1-1

Synthesis of 1,1,1-trifluoro-2-trifluoromethyl-3-methyl-2,3-butanediol

A flask was charged with 1,260 ml of 1M methylmagnesium chloride in tetrahydrofuran, to which 73.0 g of methyl 2-hydroxy-3,3,3-trifluoro-2-trifluoromethylpropionate was added dropwise below 50° C. The contents were stirred at room temperature for one hour, whereupon ammonium chloride aqueous solution was added for ordinary aqueous workup. Recrystallization from n-heptane gave 59.1 g (yield 81%) of the end compound.

Melting point: 48° C. (start at 36° C., ramp 1° C./min)
$^1$H-NMR (600 MHz in DMSO-$d_6$):
δ=1.31 (6H, s), 5.25 (1H, s), 7.43 (1H, s) ppm Synthesis Example 1-2

Synthesis of 3-hydroxy-2-methyl-4,4,4-trifluoro-3-trifluoromethylbutan-2-yl methacrylate In 300 ml of toluene were dissolved 55.0 g of the alcohol obtained in Synthesis Example 1-1 and 32.0 g of triethylamine. The solution at 10° C. was combined with 26.7 g of methacrylic chloride and stirred at the temperature for 3 hours. 100 ml of water was added to the reaction solution below 30° C. for ordinary aqueous workup. Vacuum distillation gave 57.2 g (yield 80%) of the end compound.
Boiling point: 54-55° C./500 Pa
IR (thin film):
ν=3255, 3039, 3014, 2966, 2935, 1697, 1635, 1475, 1456, 1338, 1315, 1257, 1238, 1226, 1193, 1170, 1153, 1137, 987, 946, 904 cm$^{-1}$
$^1$H-NMR (600 MHz in DMSO-$d_6$):
δ=1.72 (6H, s), 1.81 (3H, s), 5.67 (1H, app t), 5.97 (1H, app t), 8.41 (1H, s) ppm
$^{19}$F-NMR (565 MHz in DMSO-$d_6$, trifluoroacetic acid standard):
δ=−70.1 (6F, s) ppm Synthesis Example 1-3

Synthesis of Monomer 1

In 300 ml of acetonitrile were dissolved 89.1 g of the methacrylate ester obtained in Synthesis Example 1-2 and 31.2 g of pyridine. The solution at 10° C. was combined with 40.3 g of isobutyric chloride and stirred at the temperature for 3 hours. 100 ml of water was added to the reaction solution below 30° C. for ordinary aqueous workup. Vacuum distillation gave 103 g (yield 94%) of the target compound.
Boiling point: 69-70° C./20 Pa
IR (thin film):
ν=2981, 2940, 2833, 1795, 1725, 1639, 1471, 1394, 1376, 1324, 1265, 1226, 1145, 1095, 1064, 1022, 985, 973 cm$^{-1}$
$^1$H-NMR (600 MHz in DMSO-$d_6$):
δ=1.14 (6H, d), 1.80 (6H, s), 1.83 (3H, s), 2.81 (1H, sept), 5.71 (1H, m), 5.97 (1H, s) ppm Monomer Synthesis Example 2

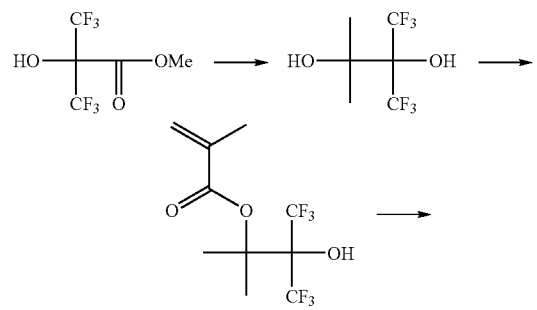

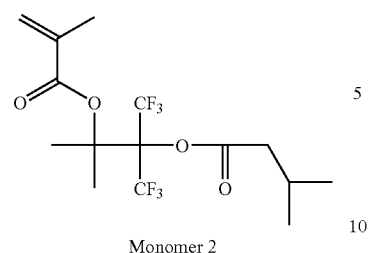

Monomer 2

In 300 ml of acetonitrile were dissolved 99.3 g of the methacrylate ester obtained in Synthesis Example 1-2 and 35.1 g of pyridine. The solution at 10° C. was combined with 49.7 g of isovaleric chloride and stirred at the temperature for 3 hours. 100 ml of water was added to the reaction solution below 30° C. for ordinary aqueous workup. Vacuum distillation gave 117 g (yield 97%) of the target compound.

Boiling point: 63-67° C./13 Pa

IR (thin film):

ν=3020, 2966, 2935, 2877, 1797, 1725, 1639, 1467, 1394, 1375, 1324, 1265, 1240, 1222, 1143, 1091, 1022, 983, 960 cm$^{-1}$ $^1$H-NMR (600 MHz in DMSO-$d_6$):

δ=0.92 (6H, d), 1.79 (6H, s), 1.82 (3H, s), 1.99 (1H, sept), 2.45 (2H, d), 5.70 (1H, app t), 5.97 (1H, s) ppm $^{19}$F-NMR (565 MHz in DMSO-$d_6$, trifluoroacetic acid standard):

δ=-64.8 (6F, s) ppm

Polymer Synthesis

Polymerizable monomers' (Monomers 1 to 13) used in polymer synthesis are identified below by their structural formulae.

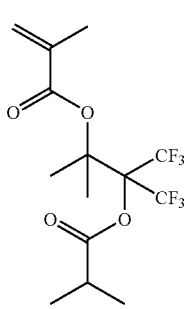

Monomer 1

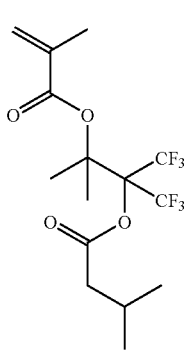

Monomer 2

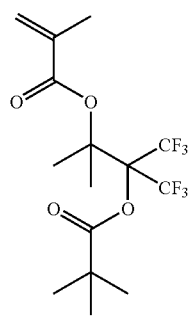

Monomer 3

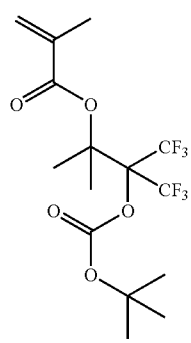

Monomer 4

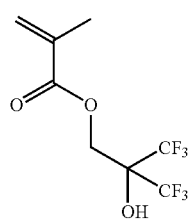

Monomer 5

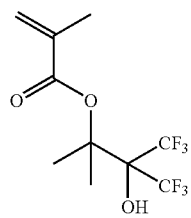

Monomer 6

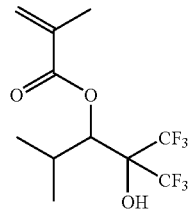

Monomer 7

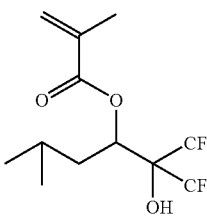

Monomer 8

-continued

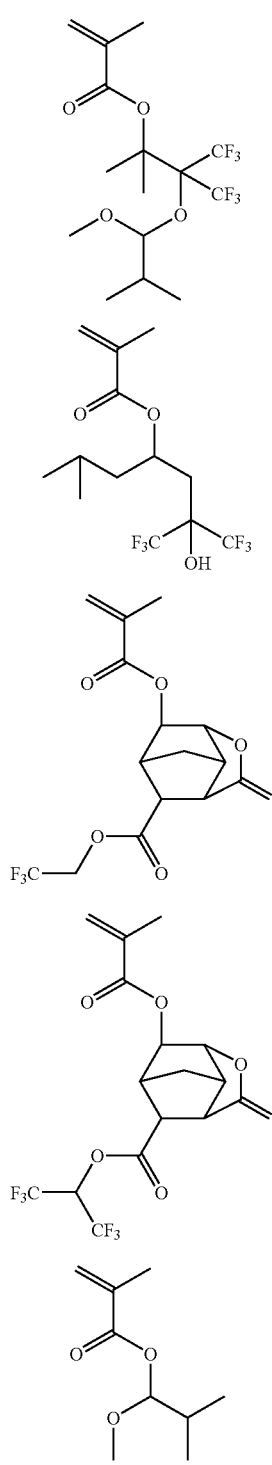

Monomer 9

Monomer 10

Monomer 11

Monomer 12

Monomer 13

Polymer Synthesis Example 1

Copolymerization of Monomers 1 and 6 (20/80)

In a nitrogen atmosphere, a flask was charged with 23.41 g of Monomer 1, 77.11 g of Monomer 6, 3.75 g of dimethyl 2,2'-azobis(isobutyrate), and 100.1 g of methyl ethyl ketone to form a monomer solution at a temperature of 20-25° C. In a nitrogen atmosphere, another flask was charged with 50.1 g of methyl ethyl ketone, which was heated at 80° C. with stirring. The monomer solution was added dropwise thereto over 4 hours. After the completion of dropwise addition, the polymerization solution was stirred for a further 2 hours while maintaining the temperature of 80° C. At the end of maturing, the solution was cooled to room temperature. To the flask 200 g of toluene was admitted. Using an evaporator, the reaction mixture was concentrated until the total weight reached 250 g. The concentrate was added dropwise to 1,500 g of hexane. The copolymer thus precipitated was separated and washed with 600 g of hexane, obtaining a white solid. The solid was vacuum dried at 50° C. for 20 hours, yielding 69.3 g of the target polymer, designated Polymer 2. On $^1$H-NMR analysis of resin composition, the copolymer consisted of Monomers 1 and 6 in a ratio of 19/81 mol %.

Polymer Synthesis Examples 2 to 19

Like Polymer 2, Polymers 1 to 19 were synthesized using the polymerizable monomers (Monomers 1 to 13) in accordance with the formulation shown in Tables 1 to 5.

TABLE 1

|  | Monomer | | | | | Yield | | |
|  | 1 | 5 | 6 | 7 | 8 | (%) | Mw | Mw/Mn |
| --- | --- | --- | --- | --- | --- | --- | --- | --- |
| Polymer 1 | 20 | 80 | | | | 70.2 | 7,200 | 1.4 |
| Polymer 2 | 20 | | 80 | | | 71.3 | 7,500 | 1.4 |
| Polymer 3 | 20 | | | 80 | | 72.2 | 7,100 | 1.4 |
| Polymer 4 | 20 | | | | 80 | 69.5 | 7,200 | 1.4 |

Polymer 1

Polymer 2

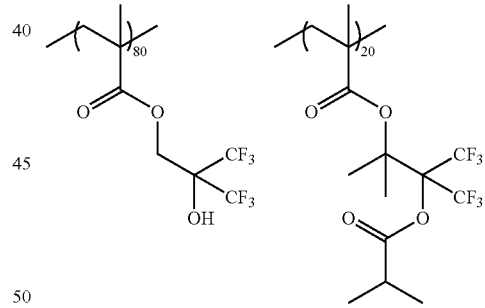

TABLE 1-continued
|  | Monomer | | | | | Yield | | |
|---|---|---|---|---|---|---|---|---|
|  | 1 | 5 | 6 | 7 | 8 | (%) | Mw | Mw/Mn |
Polymer 3
Polymer 4
TABLE 2
|  | Monomer | | | | Yield | | |
|---|---|---|---|---|---|---|---|
|  | 2 | 3 | 4 | 6 | (%) | Mw | Mw/Mn |
| Polymer 5 | 20 |  |  | 80 | 69.2 | 7,300 | 1.4 |
| Polymer 6 |  | 20 |  | 80 | 71.2 | 7,100 | 1.4 |
| Polymer 7 |  |  | 20 | 80 | 70.5 | 7,100 | 1.4 |
Polymer 5
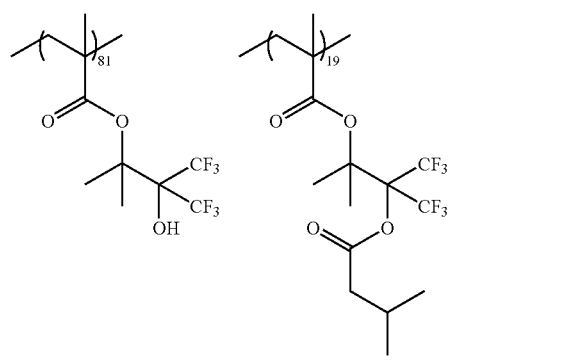
TABLE 2-continued
|  | Monomer | | | | Yield | | |
|---|---|---|---|---|---|---|---|
|  | 2 | 3 | 4 | 6 | (%) | Mw | Mw/Mn |
Polymer 6
Polymer 7
TABLE 3
|  | Monomer | | | | | Yield | | |
|---|---|---|---|---|---|---|---|---|
|  | 1 | 5 | 6 | 7 | 8 | (%) | Mw | Mw/Mn |
| Polymer 8 | 40 | 60 |  |  |  | 70.2 | 7,200 | 1.4 |
| Polymer 9 | 40 |  | 60 |  |  | 71.3 | 7,500 | 1.4 |
| Polymer 10 | 40 |  |  | 60 |  | 72.2 | 7,100 | 1.4 |
| Polymer 11 | 40 |  |  |  | 60 | 69.5 | 7,200 | 1.4 |
Polymer 8
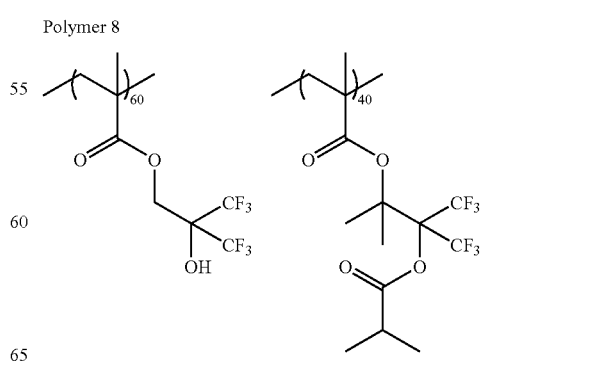

TABLE 3-continued

| | Monomer | | | | Yield | | |
|---|---|---|---|---|---|---|---|
| | 1 | 5 | 6 | 7 | 8 | (%) | Mw | Mw/Mn |

Polymer 9

Polymer 10

Polymer 11

TABLE 4

| | Monomer | | | | Yield | | |
|---|---|---|---|---|---|---|---|
| | 2 | 3 | 4 | 6 | (%) | Mw | Mw/Mn |
| Polymer 12 | 40 | | | 60 | 69.4 | 7,000 | 1.4 |
| Polymer 13 | | 40 | | 60 | 72.5 | 7,400 | 1.4 |
| Polymer 14 | | | 40 | 60 | 71.5 | 7,000 | 1.4 |

Polymer 12

TABLE 4-continued

| | Monomer | | | | Yield | | |
|---|---|---|---|---|---|---|---|
| | 2 | 3 | 4 | 6 | (%) | Mw | Mw/Mn |

Polymer 13

Polymer 14

TABLE 5

| | Monomer | | | | | | | Yield | | |
|---|---|---|---|---|---|---|---|---|---|---|
| | 1 | 6 | 9 | 10 | 11 | 12 | 13 | (%) | Mw | Mw/Mn |
| Polymer 15 | 20 | 70 | 10 | | | | | 69.9 | 7,000 | 1.4 |
| Polymer 16 | 20 | 70 | | 10 | | | | 70.5 | 7,200 | 1.4 |
| Polymer 17 | 20 | 70 | | | 10 | | | 72.2 | 7,100 | 1.4 |
| Polymer 18 | 20 | 70 | | | | 10 | | 74.1 | 7,200 | 1.4 |
| Polymer 19 | 20 | 70 | | | | | 10 | 70.5 | 7,000 | 1.4 |

Polymer 15

TABLE 5-continued

| | Monomer | | | | | | | Yield | | |
|---|---|---|---|---|---|---|---|---|---|---|
| | 1 | 6 | 9 | 10 | 11 | 12 | 13 | (%) | Mw | Mw/Mn |

Polymer 16

Polymer 17

Polymer 18

Polymer 19

Comparative Polymer Synthesis Example 1

Synthesis of homopolymer of Monomer 6

In a nitrogen atmosphere, a flask was charged with 100.0 g of Monomer 6, 3.91 g of dimethyl 2,2'-azobis-(isobutyrate), and 100.0 g of isopropyl alcohol to form a monomer solution at a temperature of 20-25° C. In a nitrogen atmosphere, another flask was charged with 50.0 g of isopropyl alcohol, which was heated at 80° C. with stirring. The monomer solution was added dropwise thereto over 4 hours. After the completion of dropwise addition, the polymerization solution was stirred for a further 3 hours while maintaining the temperature of 80° C. At the end of maturing, the solution was cooled to room temperature. The polymerization solution was added dropwise to 2,000 g of water. The polymer thus precipitated was filtered and washed four times with 600 g of a 9/1 hexane/isopropyl ether mixture, obtaining a white solid. The solid was vacuum dried at 50° C. for 20 hours, yielding 92.8 g of the target polymer, designated Comparative Polymer 1. On GPC analysis, the polymer had Mw of 7,800 and Mw/Mn of 1.6.

Evaluation of Resist Composition

A resist solution was prepared by dissolving 5 g of Resist Polymer, 0.25 g of an additive polymer selected from Polymers 8 to 19 and Comparative Polymer 1, 0.25 g of PAG1, and 0.05 g of Quencher 1 (all shown below) in 75 g of PGMEA and filtering through a polypropylene filter having a pore size of 0.2 μm. For comparative purposes, a resist solution was similarly prepared without adding the additive polymer.

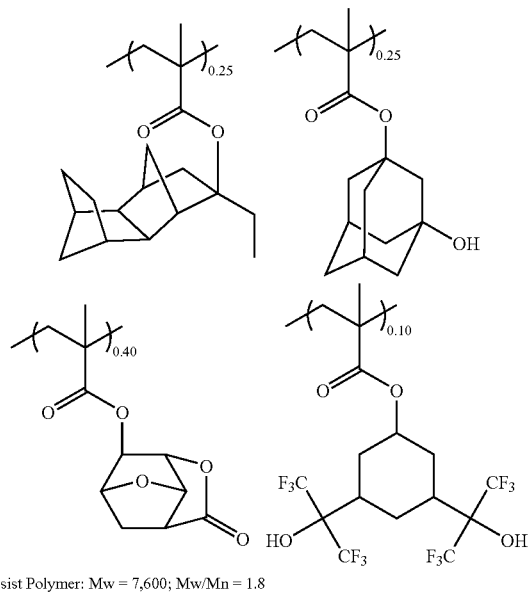

Resist Polymer: Mw = 7,600; Mw/Mn = 1.8

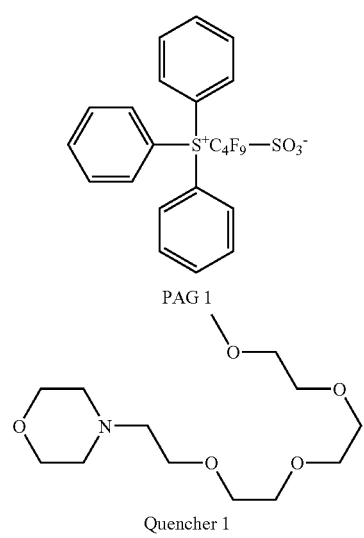

An antireflective coating ARC-29A (Nissan Chemical Co., Ltd.) was deposited on a silicon substrate to a thickness of 87 nm. The resist solution was applied onto the ARC and baked at 120° C. for 60 seconds to form a resist film of 150 nm thick.

A contact angle with water of the resist film was measured, using an inclination contact angle meter prop Master 500 by Kyowa Interface Science Co., Ltd. Specifically, the wafer covered with the resist film was kept horizontal, and 50 μl, of pure water was dropped on the resist film to form a droplet. While the wafer was gradually inclined, the angle (sliding angle) at which the droplet started sliding down was determined as well as receding contact angle. The results are shown in Table 6.

TABLE 6

| Additive Polymer | Sliding angle (°) | Receding contact angle (°) | Anion leach-out (ppb) | Sensitivity (mJ/cm$^2$) | 75-nm pattern profile |
|---|---|---|---|---|---|
| Polymer 8 | 16 | 74 | 7 | 34 | rectangular |
| Polymer 9 | 11 | 84 | 7 | 33 | rectangular |
| Polymer 10 | 9 | 85 | 6 | 34 | rectangular |
| Polymer 11 | 9 | 86 | 6 | 35 | rectangular |
| Polymer 12 | 11 | 84 | 6 | 35 | rectangular |
| Polymer 13 | 9 | 86 | 6 | 33 | rectangular |
| Polymer 14 | 10 | 82 | 7 | 33 | rectangular |
| Polymer 15 | 12 | 74 | 7 | 33 | rectangular |
| Polymer 16 | 12 | 75 | 7 | 32 | rectangular |
| Polymer 17 | 14 | 73 | 7 | 32 | rectangular |
| Polymer 18 | 14 | 73 | 6 | 32 | rectangular |
| Polymer 19 | 13 | 74 | 7 | 31 | rectangular |
| Comparative Polymer 1 | 15 | 69 | 7 | 32 | rectangular |
| not added | 28 | 40 | 60 | 45 | T-top |

A smaller sliding angle indicates an easier flow of water on the resist film. A larger receding contact angle indicates that fewer liquid droplets are left during high-speed scan exposure. It is demonstrated in Table 6 that the inclusion of the additive polymer of the invention in a resist solution achieves a drastic improvement in the receding contact angle of photoresist film without adversely affecting the sliding angle, as compared with those photoresist films free of the additive polymer.

Also, the resist film-bearing wafer (prepared above) was irradiated through an open frame at an energy dose of 50 mJ/cm$^2$ using an ArF scanner S305B (Nikon Corp.). Then a true circle ring of Teflon® having an inner diameter of 10 cm was placed on the resist film, 10 mL of pure water was carefully injected inside the ring, and the resist film was kept in contact with water at room temperature for 60 seconds. Thereafter, the water was recovered, and a concentration of photoacid generator (PAG1) anion in the water was measured by an LC-MS analyzer (Agilent). The anion concentration measured indicates an amount of anions leached out for 60 seconds. The results are also shown in Table 6. It is evident from Table 6 that a photoresist film formed from a resist solution containing the inventive polymer is effective in inhibiting the PAG from being leached out of the film in water.

Further, the resist film-bearing wafer (prepared above) was exposed by means of an ArF scanner model S307E (Nikon Corp., NA 0.85, σ 0.93, 4/5 annular illumination, 6% halftone phase shift mask), rinsed for 5 minutes while splashing pure water, post-exposure baked (PEB) at 110° C. for 60 seconds, and developed with a 2.38 wt % TMAH aqueous solution for 60 seconds, forming a 75-nm line-and-space pattern. The wafer was sectioned, and the profile and sensitivity of the 75-nm line-and-space pattern were evaluated. The results are also shown in Table 6.

As seen from Table 6, when exposure is followed by water rinsing, the resist film having the additive polymer of the invention formulated therein formed a pattern of rectangular profile, in stark contrast with the resist film free of the additive polymer of the invention forming a pattern of T-top profile.

Japanese Patent Application No. 2008-307213 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising:
    (A) a polymer comprising recurring units of the general formula (1) and recurring units of the general formulae (2a) or (2b),
    (B) a base polymer having a structure derived from lactone ring, hydroxyl group and/or maleic anhydride, said base polymer becoming soluble in alkaline developer under the action of acid,
    (C) a compound capable of generating an acid upon exposure to high-energy radiation, and
    (D) an organic solvent,

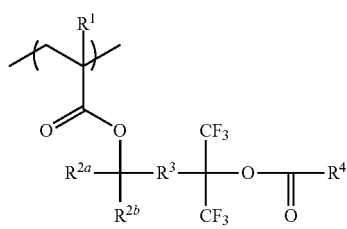
(1)

wherein $R^1$ is hydrogen, methyl or trifluoromethyl, $R^{2a}$ and $R^{2b}$ are hydrogen or straight, branched or cyclic $C_1$-$C_{15}$ alkyl, $R^{2a}$ and $R^{2b}$ may bond together to form a ring with the carbon atom to which they are attached, $R^3$ is a single bond or straight, branched or cyclic $C_1$-$C_{15}$ alkylene, and $R^4$ is a straight, branched or cyclic $C_1$-$C_{20}$ alkyl or fluoroalkyl which may contain —O— or —C(=O)—,

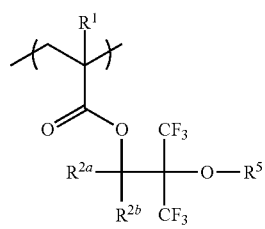
(2a)

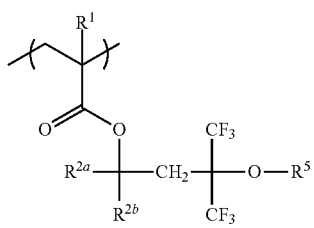
(2b)

wherein $R^1$ is hydrogen, methyl or trifluoromethyl, $R^{2a}$ and $R^{2b}$ are hydrogen or straight, branched or cyclic $C_1$-$C_{15}$ alkyl, $R^{2a}$ and $R^{2b}$ may bond together to form a ring with the carbon atom to which they are attached, and $R^5$ is hydrogen, a straight, branched or cyclic $C_1$-$C_{15}$ alkyl or fluoroalkyl, or an acid labile group, said polymer (A) being added to the resist composition in a total amount of 0.5 to 10 parts by weight per 100 parts by weight of the base polymer (B).

2. The resist composition of claim 1, further comprising (E) a basic compound.

3. The resist composition of claim 1, further comprising (F) a dissolution inhibitor.

4. A pattern forming process comprising the steps of:
    (1) applying the resist composition of claim 1 onto a substrate to form a resist film,
    (2) heat treating the resist film and exposing it to high-energy radiation through a photomask, and
    (3) developing the exposed resist film with a developer.

5. A pattern forming process comprising the steps of:
    (1) applying the resist composition of claim 1 onto a substrate to form a resist film,
    (2) heat treating the coated substrate, and exposing it to high-energy radiation through a photomask while keeping a liquid between a projection lens and the coated substrate, and
    (3) developing the exposed resist film with a developer.

6. A pattern forming process comprising the steps of:
    (1) applying the resist composition of claim 1 onto a substrate to form a resist film,
    (2) forming a protective coating on the resist film,
    (3) heat treating the coated substrate, and exposing it to high-energy radiation through a photomask while keeping a liquid between a projection lens and the coated substrate, and
    (4) developing the exposed resist film with a developer.

7. The process of claim 5, wherein the liquid is water.

8. The process of claim 6, wherein an exposure light source emits high-energy radiation having a wavelength of 180 to 250 nm.

9. A pattern forming process comprising the steps of:
    (1) applying the resist composition of claim 1 onto a mask blank to form a coating,
    (2) heat treating the coating and irradiating it in vacuum with an electron beam, and
    (3) developing the coating with a developer.

10. The composition of claim 1, wherein the polymer of component (A) is one selected from the group consisting of polymers having the following formulae:

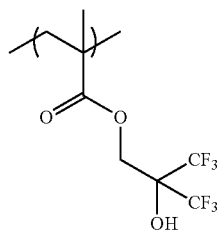 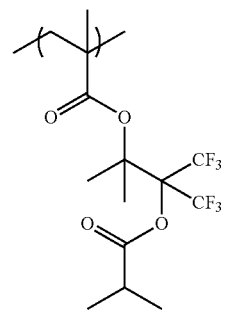

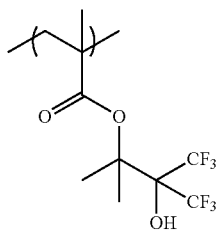
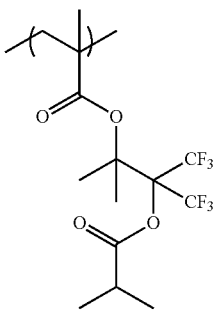
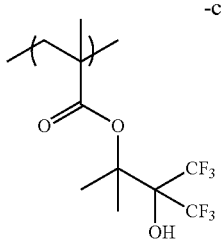
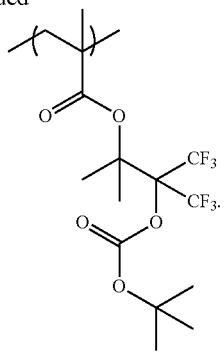
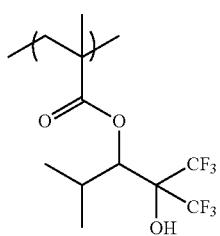
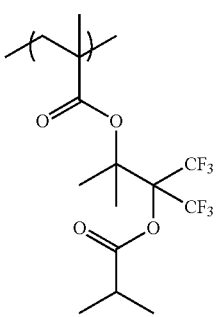

11. A resist composition comprising:
(A) a polymer comprising recurring units of the general formula (1) and recurring units of the general formula (2a),
(B) a base polymer having a structure derived from lactone ring, hydroxyl group and/or maleic anhydride, said base polymer becoming soluble in alkaline developer under the action of acid,
(C) a compound capable of generating an acid upon exposure to high-energy radiation, and
(D) an organic solvent,

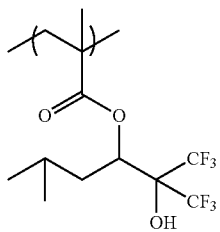
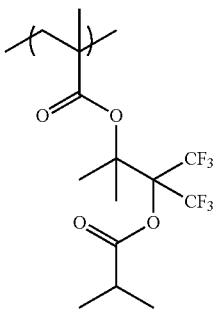

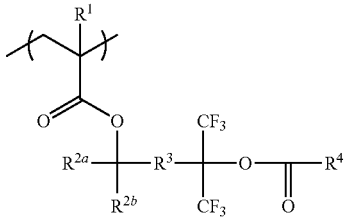

(1)

wherein $R^1$ is hydrogen, methyl or trifluoromethyl, $R^{2a}$ and $R^{2b}$ are hydrogen or straight, branched or cyclic $C_1$-$C_{15}$ alkyl, $R^{2a}$ and $R^{2b}$ may bond together to form a ring with the carbon atom to which they are attached, $R^3$ is a single bond or straight, branched or cyclic $C_1$-$C_{15}$ alkylene, and $R^4$ is a straight, branched or cyclic $C_1$-$C_{20}$ alkyl or fluoroalkyl which may contain —O— or —C(=O)—,

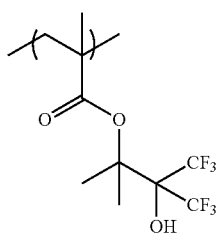
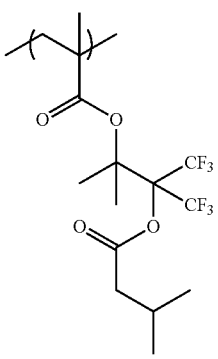

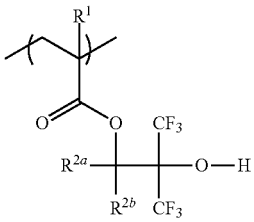

(2a)

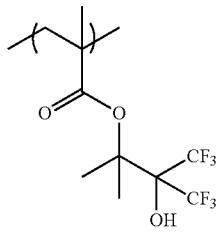
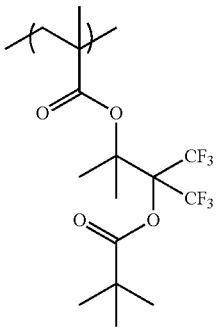

wherein $R^1$ is hydrogen, methyl or trifluoromethyl, $R^{2a}$ and $R^{2b}$ are hydrogen or straight, branched or cyclic $C_1$-$C_{15}$ alkyl, $R^{2a}$ and $R^{2b}$ may bond together to form a ring with the carbon atom to which they are attached, said polymer (A) being added to the resist composition in a total amount of 0.5 to 10 parts by weight per 100 parts by weight of the base polymer (B).

12. A pattern forming process comprising the steps of:
(1) applying the resist composition of claim 11 onto a substrate to form a resist film,
(2) heat treating the resist film and exposing it to high-energy radiation through a photomask, and
(3) developing the exposed resist film with a developer.

13. A pattern forming process comprising the steps of:
(1) applying the resist composition of claim 11 onto a substrate to form a resist film,
(2) heat treating the coated substrate, and exposing it to high-energy radiation through a photomask while keeping a liquid between a projection lens and the coated substrate, and
(3) developing the exposed resist film with a developer.

14. A pattern forming process comprising the steps of:
(1) applying the resist composition of claim 11 onto a substrate to form a resist film,
(2) forming a protective coating on the resist film,
(3) heat treating the coated substrate, and exposing it to high-energy radiation through a photomask while keeping a liquid between a projection lens and the coated substrate, and
(4) developing the exposed resist film with a developer.

15. The process of claim 14, wherein the liquid is water.

16. The process of claim 14, wherein an exposure light source emits high-energy radiation having a wavelength of 180 to 250 nm.

17. A pattern forming process comprising the steps of:
(1) applying the resist composition of claim 11 onto a mask blank to form a coating,
(2) heat treating the coating and irradiating it in vacuum with an electron beam, and
(3) developing the coating with a developer.

18. The resist composition comprising:
(A) a polymer comprising recurring units of the general formula (1), recurring units of the general formula (2a) and a recurring unit selected from the general formula (2b), (2c) or (2d),
(B) a base polymer having a structure derived from lactone ring, hydroxyl group and/or maleic anhydride, said base polymer becoming soluble in alkaline developer under the action of acid,
(C) a compound capable of generating an acid upon exposure to high-energy radiation, and
(D) an organic solvent,

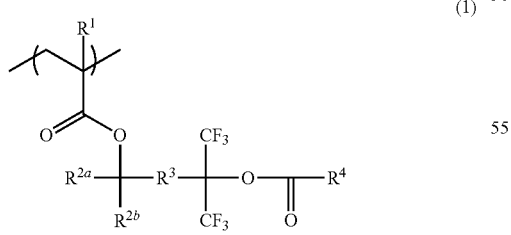
(1)

wherein $R^1$ is hydrogen, methyl or trifluoromethyl, $R^{2a}$ and $R^{2b}$ are hydrogen or straight, branched or cyclic $C_1$-$C_{15}$ alkyl, $R^{2a}$ and $R^{2b}$ may bond together to form a ring with the carbon atom to which they are attached, $R^3$ is a single bond or straight, branched or cyclic $C_1$-$C_{15}$ alkylene, and $R^4$ is a straight, branched or cyclic $C_1$-$C_{20}$ alkyl or fluoroalkyl which may contain —O— or —C(=O)—,

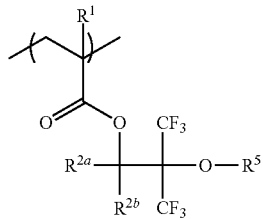
(2a)

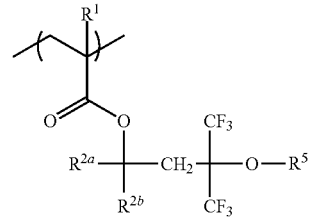
(2b)

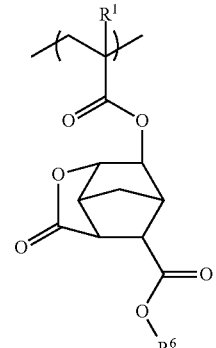
(2c)

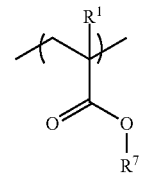
(2d)

wherein $R^1$ is hydrogen, methyl or trifluoromethyl, $R^{2a}$ and $R^{2b}$ are hydrogen or straight, branched or cyclic $C_1$-$C_{15}$ alkyl, $R^{2a}$ and $R^{2b}$ may bond together to form a ring with the carbon atom to which they are attached, $R^5$ is hydrogen, a straight, branched or cyclic $C_1$-$C_{15}$ alkyl or fluoroalkyl, or an acid labile group, $R^6$ is a straight, branched or cyclic $C_1$-$C_{15}$ fluoroalkyl, and $R^7$ is an acid labile group, said polymer (A) being added to the resist composition in a total amount of 0.5 to 10 parts by weight per 100 parts by weight of the base polymer (B).

19. A resist composition comprising:
(A) a polymer selected from the group consisting of polymers having the following formulae:

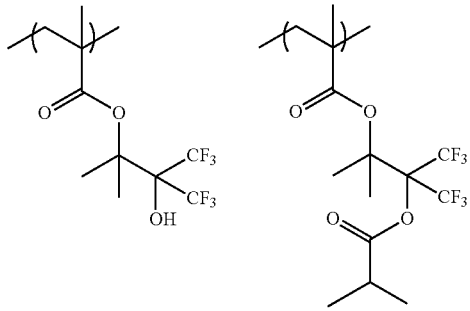

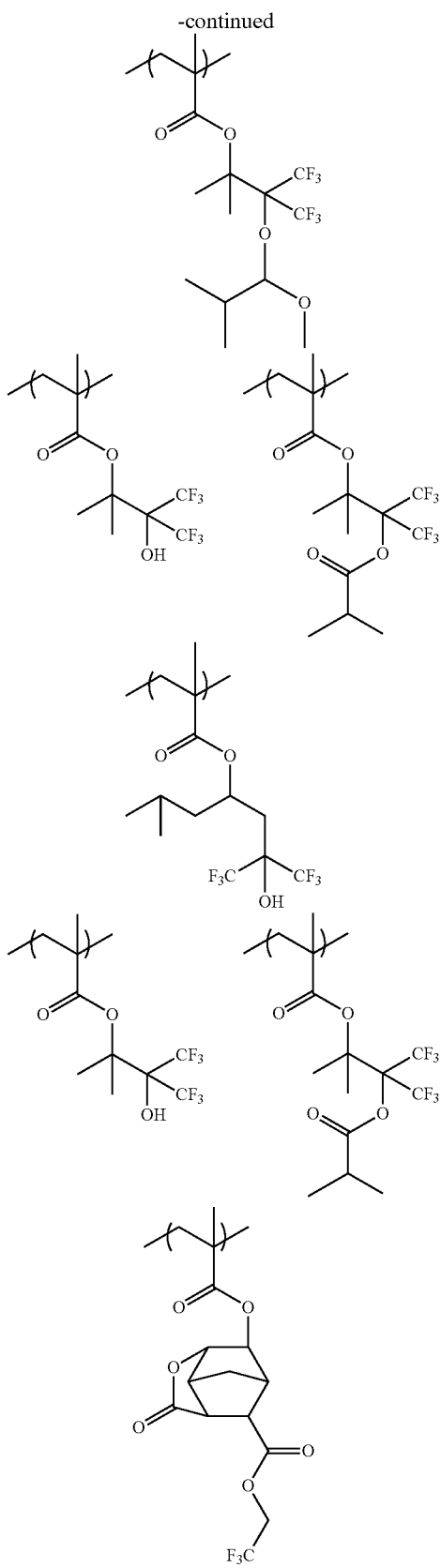
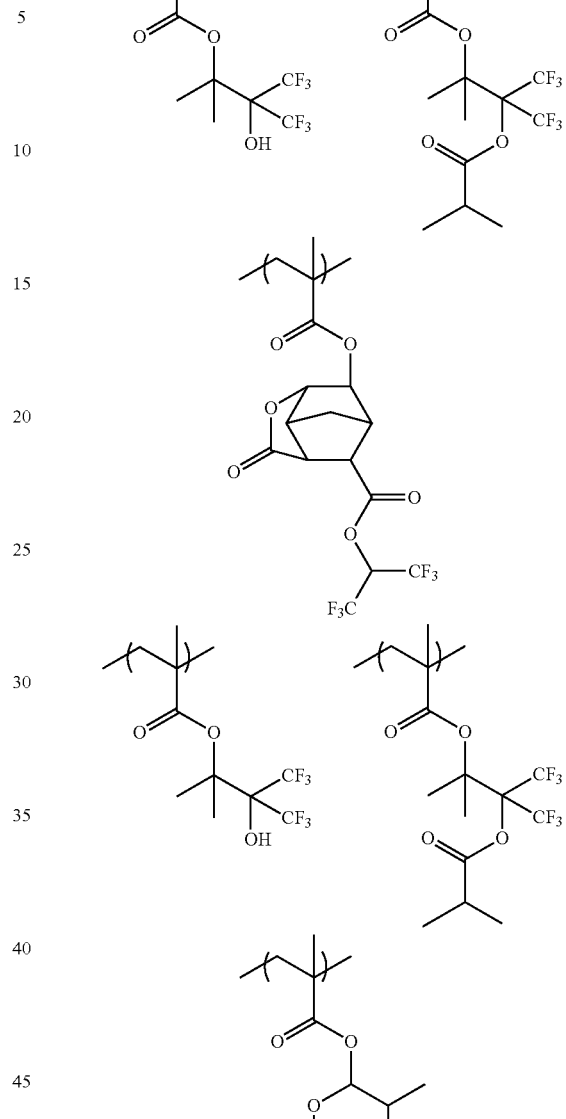

(B) a base polymer having a structure derived from lactone ring, hydroxyl group and/or maleic anhydride, said base polymer becoming soluble in alkaline developer under the action of acid, (C) a compound capable of generating an acid upon exposure to high-energy radiation, and (D) an organic solvent, said polymer (A) being added to the resist composition in a total amount of 0.5 to 10 parts by weight per 100 parts by weight of the base polymer (B).

* * * * *